US008628992B2

(12) United States Patent
Gabor et al.

(10) Patent No.: US 8,628,992 B2
(45) Date of Patent: Jan. 14, 2014

(54) METHODS TO PATTERN DIFFUSION LAYERS IN SOLAR CELLS AND SOLAR CELLS MADE BY SUCH METHODS

(75) Inventors: Andrew M. Gabor, Providence, RI (US); Richard L. Wallace, Acton, MA (US)

(73) Assignee: 1366 Technologies, Inc., Bedford, MA (US)

( * ) Notice: Subject to any disclaimer, the term of this patent is extended or adjusted under 35 U.S.C. 154(b) by 244 days.

(21) Appl. No.: 12/937,829

(22) PCT Filed: Apr. 17, 2009

(86) PCT No.: PCT/US2009/002422
§ 371 (c)(1),
(2), (4) Date: Feb. 11, 2011

(87) PCT Pub. No.: WO2009/145857
PCT Pub. Date: Dec. 3, 2009

(65) Prior Publication Data
US 2011/0146782 A1      Jun. 23, 2011

Related U.S. Application Data

(60) Provisional application No. 61/201,577, filed on Dec. 12, 2008, provisional application No. 61/124,607, filed on Apr. 18, 2008.

(51) Int. Cl.
*H01L 21/00* (2006.01)
(52) U.S. Cl.
USPC .............. 438/57; 438/66; 257/E25.009
(58) Field of Classification Search
USPC .................. 438/57, 66; 257/E25.009
See application file for complete search history.

(56) References Cited

U.S. PATENT DOCUMENTS

| 5,258,077 | A | * | 11/1993 | Shahryar | ................ 136/256 |
| 5,389,573 | A | | 2/1995 | Itagaki | |
| 6,091,021 | A | | 7/2000 | Ruby et al. | |
| 6,429,037 | B1 | | 8/2002 | Wenham et al. | |
| 6,825,104 | B2 | | 11/2004 | Horzel et al. | |
| 6,872,588 | B2 | | 3/2005 | Chabinyc et al. | |
| 7,335,555 | B2 | | 2/2008 | Gee et al. | |
| 2005/0268963 | A1 | * | 12/2005 | Jordan et al. | ................ 136/256 |

(Continued)

OTHER PUBLICATIONS

Notification of Transmittal of the International search Report and the Written Opinion of the International Searching Authority, PCT 09/02422, Sep. 5, 2012.

(Continued)

*Primary Examiner* — Brook Kebede
(74) *Attorney, Agent, or Firm* — Steven J. Weissburg

(57) ABSTRACT

Methods exploiting a Self Aligned Cell (SAC) architecture for doping purposes, use the architecture to direct the deposition and application of either a dopant or a diffusion retarder. Doping is provided in regions that will become metallization for conducting fingers. Dopant may be treated directly into metallization grooves. Or, diffusion retarder may be provided in non-groove locations, and dopant may be provided over some or all of the entire wafer surface. Dopant and metal automatically go where desired, and in register with each other. The SAC architecture also includes concave surfaces for light absorbing regions of a cell, to reduce reflection of light energy, which regions may also be treated with dopant in the concavities, to result in semi-conductor emitter lines. Alternatively, diffusion retarder may be treated into the concavities, leaving upper tips of ridges between the concavities exposed, thereby subject to deeper doping.

16 Claims, 20 Drawing Sheets

(56) References Cited

U.S. PATENT DOCUMENTS

| | | |
|---|---|---|
| 2007/0169806 A1 | 7/2007 | Fork et al. |
| 2008/0092944 A1 | 4/2008 | Rubin |
| 2008/0290368 A1 | 11/2008 | Rubin |

OTHER PUBLICATIONS

1st OA for CN Patent App. No. 200980123579.8, mailed Apr. 20, 2012, which also claims priority to PCT/US09/02422, as does the present Application.

2nd OA for CN Patent App. No. 200980123579.8, mailed Nov. 29, 2012, which also claims priority to PCT/US09/02422, as does the present Application.

English translation of Notification to Grant Patent from the Chinese Patent Office dated May 2, 2013. The Chinese Patent Application No. 200980123579.8 claims priority to PCTUS2009/02422, to which the present application also claims priority.

English translation of the Reasons for Refusal from the Japanese Patent Office dated May 7, 2013. The Japanese Patent Application No. 2011-505035 claims priority to PCTUS2009/02422, to which the present application also claims priority.

* cited by examiner

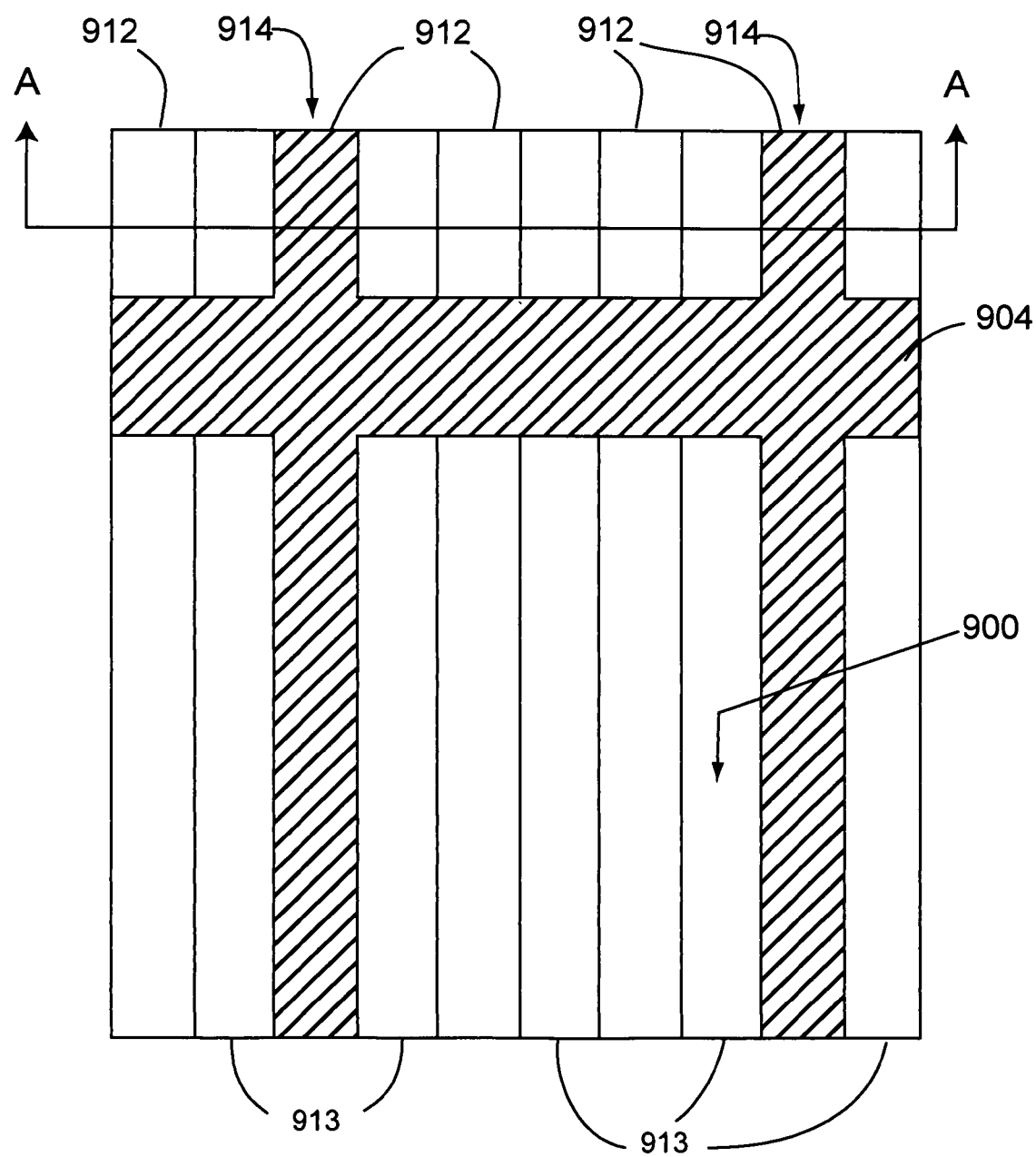
Fig. 9B-II

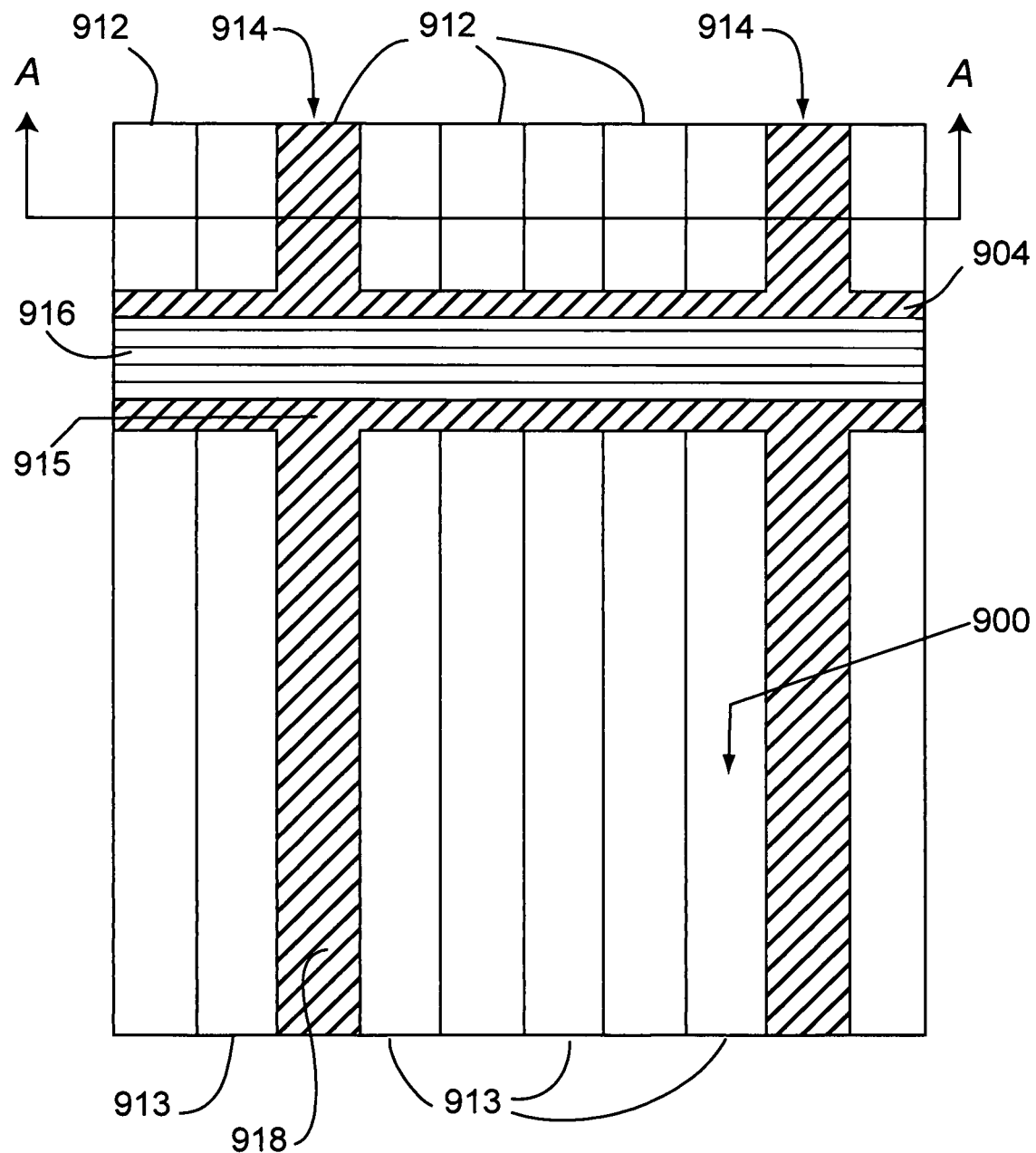
Fig. 9D-II

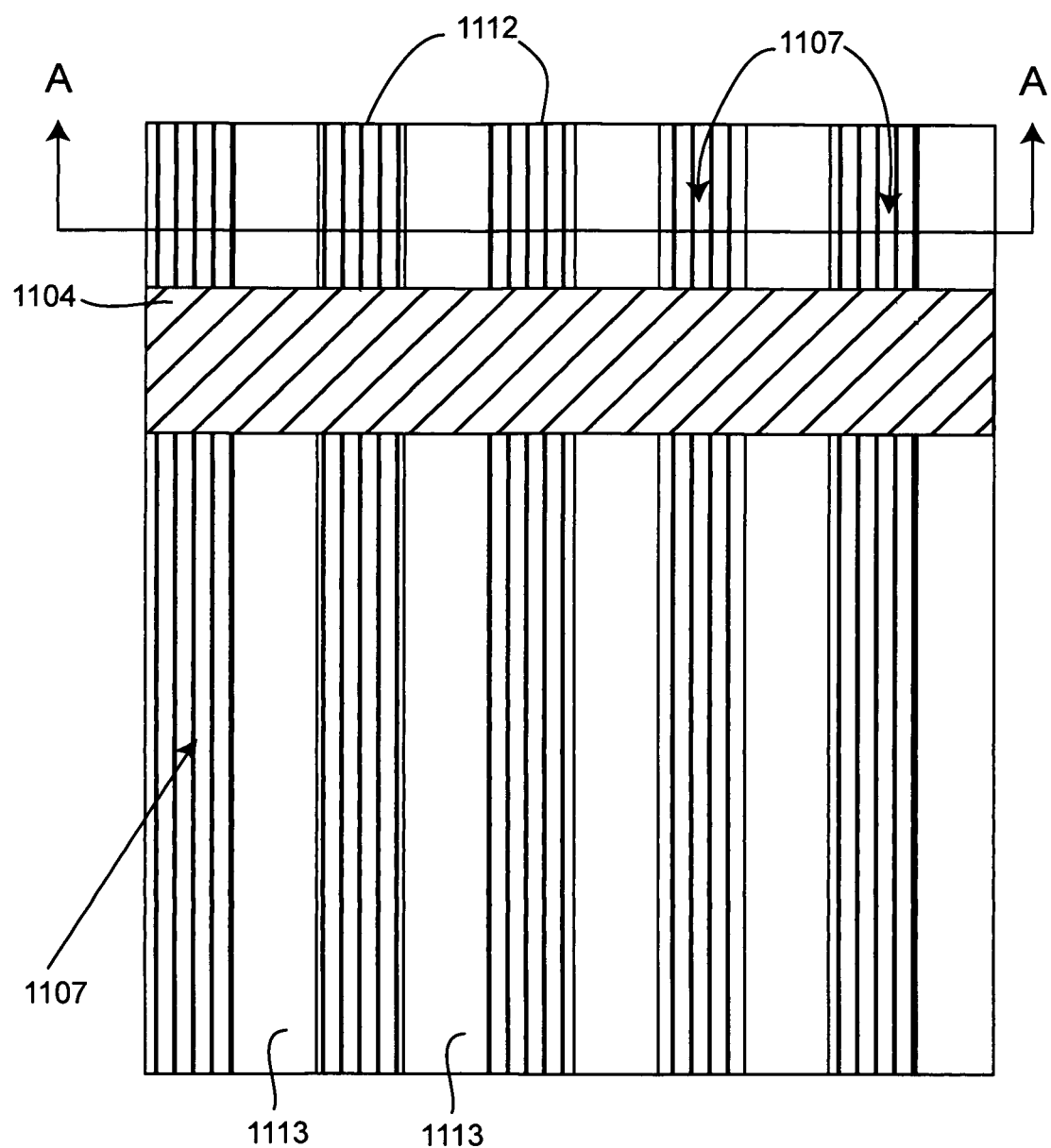
Fig. 11B-II

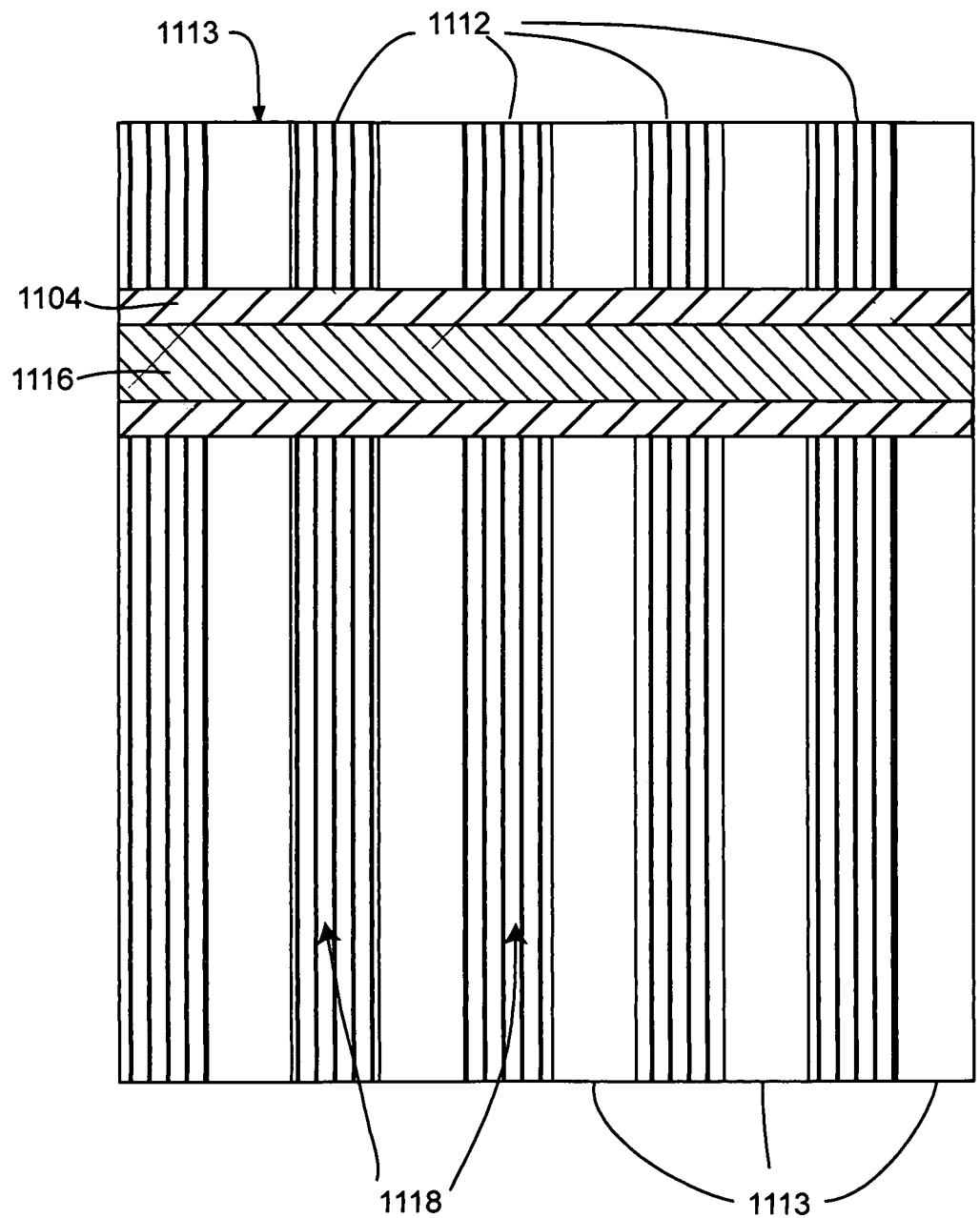
Fig. 11D-II

METHODS TO PATTERN DIFFUSION LAYERS IN SOLAR CELLS AND SOLAR CELLS MADE BY SUCH METHODS

INTRODUCTION

Certain processing schemes and architecture are disclosed in Patent Cooperation Treaty Application No: PCT/US2008/002058, entitled, SOLAR CELL WITH TEXTURED SURFACES, filed Feb. 15, 2008, in the names of Emanuel M. Sachs and James F. Bredt and The Massachusetts Institute of Technology, designating the United States of America, and also claiming priority to two provisional U.S. applications, No. U.S. 60/901,511, filed Feb. 15, 2007, and No. U.S. 61/011,933, filed Jan. 23, 2007. All of the PCT application and the two US provisional applications are hereby incorporated fully herein by reference. The technology disclosed in these applications is referred to herein collectively as Self Aligned Cell (SAC) technology.

Certain additional processing schemes and architecture are disclosed in U.S. Provisional Application No: U.S. Ser. No. 61/124,607, entitled, METALLIZATION ASPECTS OF SELF ALIGNED CELL ARCHITECTURE, filed Apr. 18, 2008, in the names of Emanuel M. Sachs and James F. Bredt and Andrew Gabor. Yet more processing schemes and architectures are disclosed in U.S. Provisional Application No U.S. Ser. No. 61/201,577, entitled, METHODS TO PATTERN DIFFUSION LAYERS IN SOLAR CELLS, filed Dec. 12, 2008, in the names of Andrew Gabor and Richard L. Wallace. The present application is a normal application, based on both of these two provisional applications, the benefit of each of which and priority to each of which is hereby claimed. Both are hereby incorporated fully herein by reference.

The present disclosure describes methods to form a selective emitter that are compatible with the SAC technology.

Briefly, the SAC concepts involve the formation of grooves and other features into the surface of Si wafers that allow subsequent processing steps involving the dispensing of solutions into the grooves to perform the operations of etching dielectrics, catalyst application, depositing metals, and masking against subsequent processing activities.

Certain processing schemes for providing liquid containing material to a surface are discussed in U.S. Provisional Application 61/204,382 entitled, DISPENSING LIQUID CONTAINING MATERIAL TO PATTERNED SURFACES USING A CAPILLARY DISPENSING TUBE, filed on Jan. 6, 2009. This application is incorporated fully herein by reference. The technology disclosed in this application is referred to herein as Capillary Dispensing Technology. The Capillary Dispensing Technology and the provisional application that describes it is explicitly declared not to be prior art to inventions described and claimed herein. Briefly, liquids, slurries and pastes and other liquid bearing material are deposited into grooves upon a surface of a substrate, such as a silicon wafer that will be used to form a photovoltaic solar cell. Liquid can be dispensed into grooves in which will be formed thin metallization finger elements, under pressure through a fine dispensing capillary tube, which is mechanically guided and aligned by following topography/surface texture on the substrate surface. The dispensing capillary tube mechanically tracks in the groove, much like a phonograph needle in an audio record. The dispensing capillary may be small enough that it rests at the groove, with the groove sidewalls providing tracking restraint. Or, the dispensing capillary may be larger than the groove and may ride on the top edges of the groove, still achieving mechanical alignment. The dispensing capillary is typically further held to the groove by the capillary action of the dispensed liquid itself. The dispensing capillary may be spring loaded against the groove. Lead-in features may guide the dispensing capillary into the groove. Non-circular cross-sections for the dispensing capillary tube, such as elliptical, and lobed, can enhance tracking in a groove. A multiplicity of dispensing capillaries may be used, each dispensing in a separate groove for an individual finger. A number of wafers can be treated in a line. Time spent accelerating and decelerating at the beginning and end of travel is reduced. A plurality of wafers may be disposed on faces of a drum with flats and, with the drum rotating continuously. The dispensing capillary tube can be traversed parallel to the drum axis while moving in and out to provide rise and fall as an individual wafer is traversed.

The innovations discussed herein involve dispensing dopant-containing liquids into the metallization groove patterns and/or applying diffusion-retarding materials outside the metallization groove areas to improve the device performance through the formation of what is referred to herein as a selective emitter. A new facet of self alignment is thereby achieved through use of the same grooves to facilitate the dispensing and/or constraining of dopant and diffusion-retarding materials as are used for the dispensing and constraining of metallization materials.

In a conventional Si wafer based solar cell, a wafer with minimal B (boron) doping has a thin layer of P (phosphorus) dopant diffused into the top side of the cell to form the emitter region, where a permanent electrical field is thus created to separate charges generated by light. A high P concentration has the benefits of allowing a low contact resistance with some types of metallization, aiding in the striking of Ni plating solutions directly on the Si surface, and reducing the tendency of the front metallization to punch through the diffused region and thus short or shunt the device. It also builds in a conductive surface layer allowing electrons to move along the surface toward a metallized conductor with little resistive losses.

However, a high concentration of P and a deep emitter have drawbacks as well. The short wavelength light tends to be absorbed very strongly in a thin layer near the top of the wafer in this diffused region, and high P doping levels reduce the electronic quality of the material such that charge carriers more easily recombine at defects before they are able to be collected. In this way the short wavelength or blue light that is absorbed strongly near the surface contributes less to the photocurrent of the device in what is typical referred to as a poor blue response of the cell. Additionally, in high performance cell designs the quality of the very top surface can be important and influence the open circuit voltage of the device. With higher surface P concentrations, it becomes more challenging to obtain good surface passivation with front surface dielectric layers.

To achieve the benefits of both high and low dopant concentrations, but few of the deficits, a selective emitter can be used. As used herein, a selective emitter is a patterned diffusion layer. Under the metallization regions, there are high dopant, such as P concentrations, for low contact resistance and wider metallization process windows, but elsewhere in the great majority of the surface area, there are low concentrations for higher voltage and current in the cells. Only a very small percentage of present Si solar cell manufacturers employ selective emitters, since the additional processing steps and process complexity needed to create the patterned diffusion are difficult obstacles. Common methods to produce selective emitters involve at least two high temperature diffusion steps and a difficult alignment of a screen printed metal layer to the heavily diffused pattern.

While the selective emitter is the most commonly published example of a patterned diffusion layer for Si solar cells, there are other examples. A so-called semiconductor finger technology is known whereby deeply diffused lines with no metal on top are formed perpendicular to the typical metal fingers. These semiconductor fingers reduce series resistance losses in the emitter and allow the regions with no such semiconductor fingers to be diffused more lightly for improved blue response, and improve the minority carrier lifetime of the Si through the better gettering of impurities from these deeply diffused regions and the surrounding areas. By deeply diffused, it is generally meant that, given a large enough area to measure sheet resistance with a four point probe, the sheet resistance would be lower than approximately fifty ohms/square and preferrably between about twenty and about thirty-five ohms/square.

Known methods of providing a selective emitter have drawbacks. They require special aligning steps to place the dopant for the more highly doped regions in the locations that will subsequently be metallized. Thus, it is necessary to use multiple masks, or to keep a mask in place from one step to another, or to otherwise bring one patterning step for the doping into register with another patterning step for the metallization. Another drawback of known selective emitter processing methods is that at least two high temperature treatment steps, each with its attendant preparations, cooling down periods, etc. It would be desirable to accomplish all high temperature processing in a single step, thereby streamlining processing, reducing processing time, etc.

As with an emitter selectively located under the metallization regions, known ways to provide so-called semiconductor fingers require two high temperature heating steps, and also require patterning of the lines that are perpendicular to the conventional metal fingers. This requires some sort of precise patterning, either by a screen printed pattern, or some other technique. Such techniques have drawbacks. It would be advantageous to be able to provide such a pattern of enhanced doping, without the need to use a conventional pattern and without two high temperature steps.

Thus, there is a need for a process for providing a selective emitter that is self-aligning, whereby the dopant is provided in precisely the locations where it is needed for metallization, without requiring use of an additional mask or screen or other patterning step and/or alignment step. There is further a need for a method that enables providing metallization liquid relatively easily, reliably, repeatably in the same locations that have been more highly doped, which will become the selective emitter regions. Further there is a need for a method that can provide such a selective emitter with more highly doped regions, by using only a single high temperature processing step. A high temperature processing step is used herein to mean a step at a high enough temperature or different temperatures in combination with a long enough time at that temperature or temperatures, to change the dopant diffusion profile. There may be other processing steps at lower or shorter temperatures during which there is no significant change in the dopant diffusion profile, but only one profile-changing high temperature step should be required.

Similarly, in the case of patterned diffusion layers other than beneath the metallization regions, such as so-called semiconductor fingers perpendicular to conventional metal fingers, there is a need for a method to provide such enhanced deep doping without requiring a complex patterning step, and a further need to provide such enhanced deep doping by using only a single high temperature processing step.

BRIEF DESCRIPTION OF FIGURES OF THE DRAWING

The several objects of inventions disclosed and claimed herein will be more fully understood with reference to the accompanying claims and figures, of which:

FIG. 9B-II is a schematic representation, in a plan view of a workpiece wafer to which deep emitter gridlines are to be applied, using a dopant dispensing method, at the stage shown in FIG. 9B;

FIG. 9D-II is a schematic representation, in a plan view of the workpiece wafer shown in FIG. 9B-II, to which deep emitter lines have been applied, using a dopant dispensing method, after that shown in FIG. 9D, after diffusion, and after a front metallization has been applied;

FIG. 11B-II is a schematic representation, in a plan view of a workpiece wafer to which deep emitter gridlines will be applied, using a diffusion-retarding material method, at the stage shown in FIG. 11B;

FIG. 11D-II is a schematic representation, in a plan view of the workpiece wafer shown in FIG. 11B-II, to which deep emitter gridlines have been applied, using a diffusion-retarding material method, after the stage shown in FIG. 11D, after diffusion, and after a front metallization has been applied;

PARTIAL SUMMARY

Figure 1A:
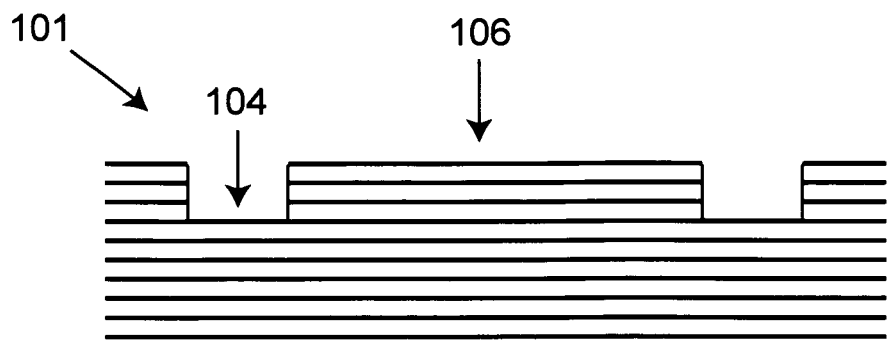
FIGS. 1A-1D are schematic representations in cross-section of a workpiece wafer at different stages of a process for applying dopant selectively.
Figure 1B:
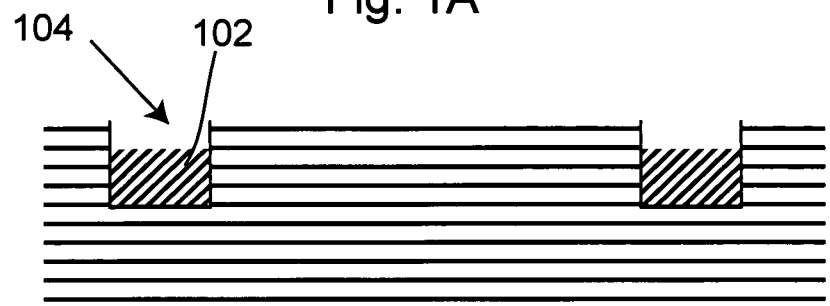
Figure 1C:
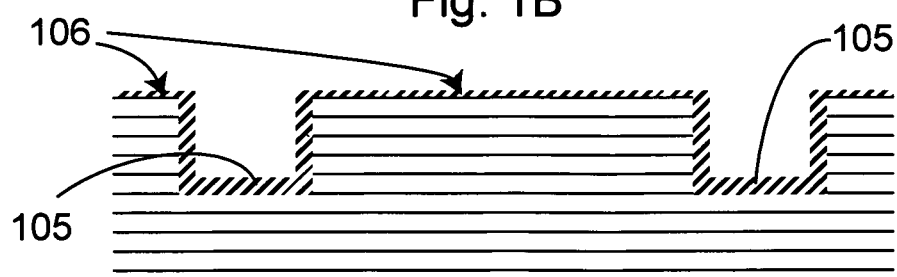

A more detailed summary is provided below, preceding the claims. Innovations disclosed herein relate to methods of exploiting the SAC architecture for doping purposes either using the architecture to direct the deposition and application of a material that dopes the substrate, or of a material that retards the substrate doping. Some innovations disclosed herein relate to providing such doping in the regions that will become metallization for current conducting fingers. The dopant may be treated directly into grooves that have been provided for the purpose. Then, metallization is provided in the same grooves and is thus automatically aligned with the region that is doped more deeply. Or, a diffusion-retarding material may be provided in non-groove locations, and dopant may be provided with less precision over the entire surface of the wafer, thereby resulting in only the diffusion-retarder free regions getting the full dopant dose. The SAC architecture also discloses textured surfaces (such as pitted or grooved) for the light absorbing regions of a cell, to prevent or minimize reflection away, of light energy. The light trapping regions may also be treated with dopant in the grooves, to result in deep emitter gridlines (similar to semiconductor fingers) within the grooves. Alternatively, a diffusion-retarding material may be treated into the grooves or pits, leaving the upper tips of the ridges between the grooves or pits exposed, thereby subject to deeper, or more significant doping in a subsequent step. Or, alternatively, additional grooves or other continuous pathways may be provided through a field of other texture, such as pits, and dopant may be provided in the additional grooves to subsequently become deep emitter gridlines through a field of light trapping texture, such as pits.

DETAILED DESCRIPTION

Innovations disclosed herein include but are not limited to ways to form: 1) a selective emitter with deeper diffusion under the metallization areas for good contact resistance and good blue response; and 2) deep emitter gridlines. In contrast to known techniques for providing a selective emitter, which require alignment of a metal layer to the heavily diffused pattern, as well as at least two high temperature steps, the elegance of the general SAC architecture lends itself to implementation of a selective emitter with minimal extra processing and complexity. It is not necessary to maintain two different instances of the same pattern in register, and only one high temperature step is required. The process is self-aligning.

Similarly, it may be more cost effective to use the SAC architecture than to use other processing schemes to provide deep emitter gridlines, for instance perpendicular to conventional metal fingers (oriented in the same manner as the so-called semiconductor fingers).

A typical basic processing sequence for an SAC process, without any patterned diffusion layer, might involve: depositing resist and possible patterning; etching grooves/features; diffusing dopant (e.g., P) to form the emitter (for example in a $POCl_3$ tube furnace or, after dispensing liquid dopant, in a belt furnace); removing backside emitter and etching front P-glass; depositing SiN on front; depositing dielectric layers on the backside, forming back metal contacts and firing them, dispensing etch solution in the front metallization grooves to remove the SiN; dispensing catalyst solution in those grooves; dispensing Ni solution in the grooves; sintering; and electroplating (possibly light-induced) metals into the grooves. Rather than electroplating, other techniques can be used to provide metal into the grooves, such as pastes or inks of metal powder, such as Ag (Silver) and glass frit or Ag organometallics with liquid glass chemistry. When using such pastes or inks, the metal deposited by such a technique could be used to form a thin seed layer only, such that the bulk of the metal is deposited by plating-up additional metal on top of the fired seed layer. Innovations related to patterning diffusion layers disclosed herein are not, then, tied to any specific method for providing metallization to the grooves, and can be used with any compatible metallization technique.

Selective Emitter

Figure 1D:
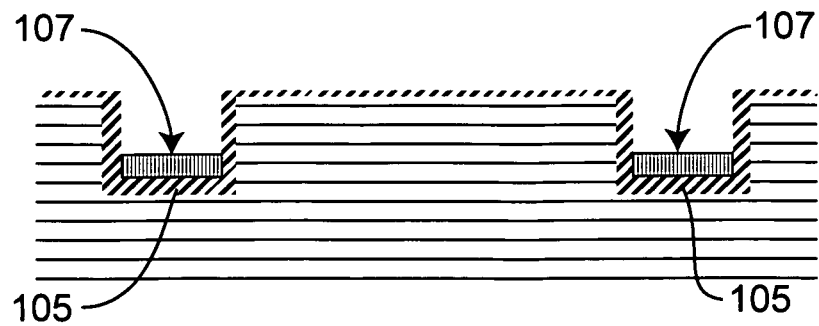
Figure 2:
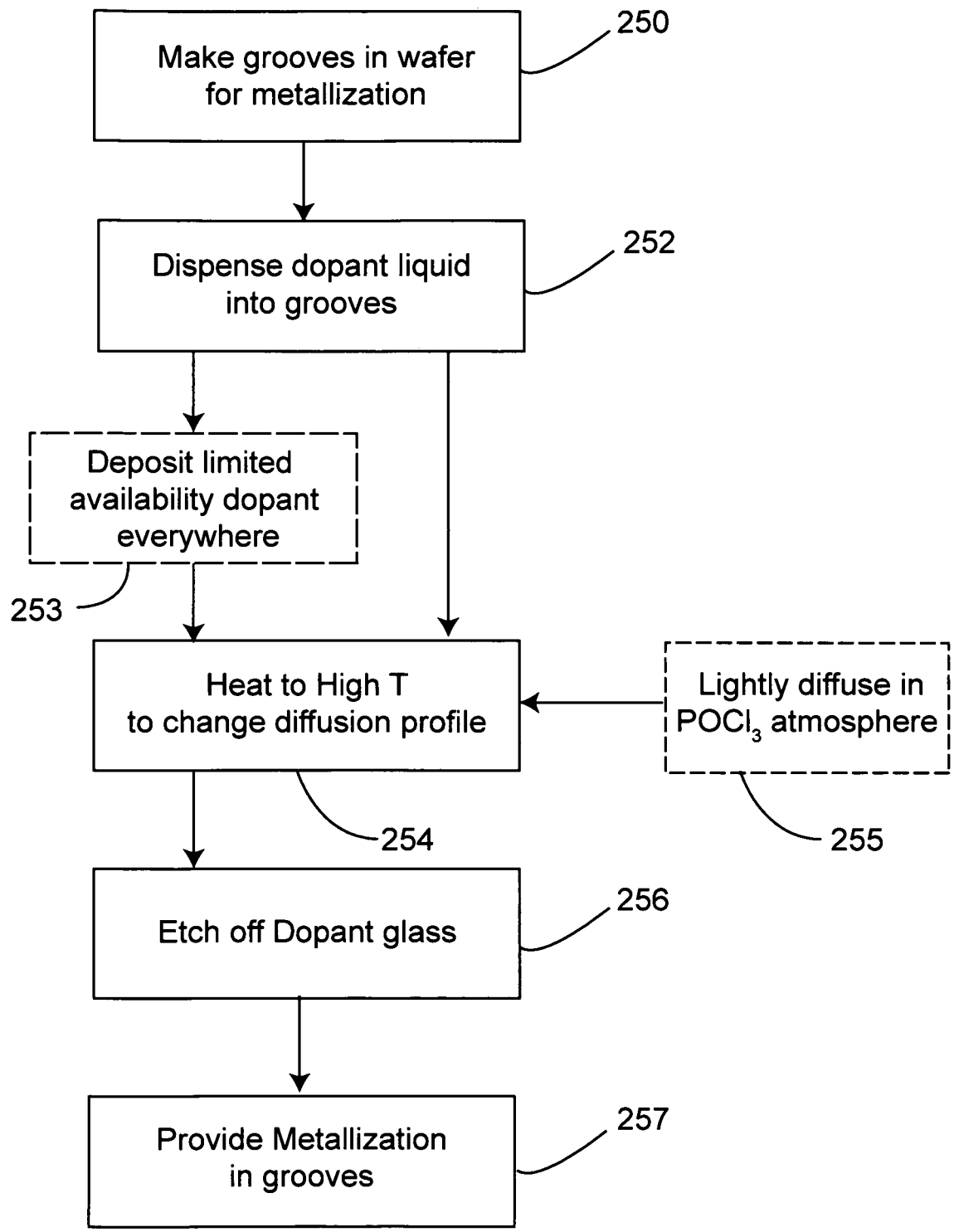
FIG. 2 is a schematic representation in flow-chart form of several typical process steps for applying dopant selectively to a workpiece wafer, showing a basic series and alternative steps.

The processes described immediately below are illustrated schematically with reference to FIGS. 1A, 1B, 1C and 1D, showing a workpiece at different stages of a process, and FIG. 2, showing typical process steps. Grooves 104 are provided in a wafer 101, for subsequent metallization. A liquid 102 containing a dopant, such as P, is dispensed 252 into the grooves 104 intended for metallization. A subsequent, single, high temperature thermal step could diffuse 254 the P dopant 102 most heavily into these groove regions 104 to provide a deeper diffusion region 105 that will become a selective emitter. The dopant P-liquid could be, but is not limited to, Phosphoric acid, a sol gel solution (e.g Filmtronics P508), or a solution containing P-O compounds such as $P_2O_5$. The phosphorus glass is then etched away 256, using known techniques, such as using hydrofluoric acid. As shown in FIG. 1D, shows the metallization 107 provided 257 in the groove 104, in registration with the region 105 of deeper diffusion. Typically, other processing steps may take place before the metallization step 257, but it is not necessary to discuss them to explain innovations disclosed herein.

Figure 3:
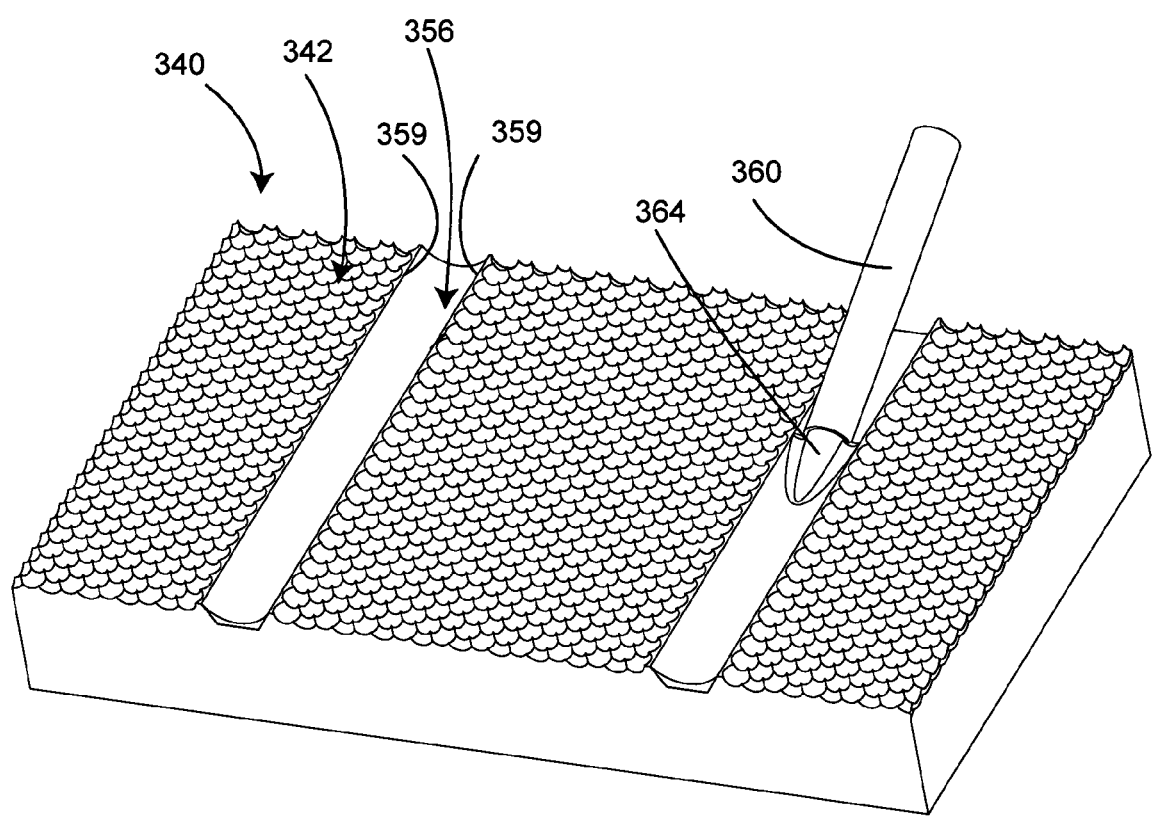
FIG. 3 shows, schematically, a semiconductor wafer having a field of pits for light trapping purposes, and two grooves, with a capillary tube dispensing material containing liquid into one of the grooves.

As mentioned above, the capillary dispensing technology can be used to dispense liquid containing dopant into the grooves. FIG. 3 shows, schematically, an enlarged portion of a work piece 340, such as a silicon wafer that will become part of a solar cell. The surface 342 is textured with a light trapping (also referred to herein as reflection reducing) topography, such as overlapping hemispherical pits as shown here, or grooves. Mechanical guidance of the dispensing capillary tube 360 is accomplished by at least two mechanisms, both of which involve interaction with the groove 356. This embodiment will be used to illustrate the general principal. According to one guidance mechanism, the dispensing capillary tube 360 mechanically tracks in the groove, much like a phonograph needle in an audio record popularly in use before the advent of magnetic and digital media. In some cases, as shown in FIG. 3, the dispensing capillary tube 360 is small enough that it rests directly on the bottom of the groove 356, and the sidewalls 359 of the groove provide for tracking.

In other cases, not shown, the dispensing capillary tube 360 is larger than the dimension of the treated groove and therefore rides on the top edges of the groove, still achieving mechanical alignment. According to a second guidance mechanism, the dispensing capillary tube 360 is further held to the groove by the capillary action of the dispensed liquid 364 itself. Mechanical tracking of a dispensing capillary tube in a groove is aided by having the dispensing capillary tube spring loaded against the groove. Spring loading can be accomplished using the elasticity of the dispensing capillary tube 360 itself. The capillary dispensing technology is described more fully in the U.S. Provisional application U.S. Ser. No. 61/204,382, mentioned above.

The dopant liquid can be dispensed directly into the grooves intended for the fine metallization fingers or the liquid can be dispensed into the wider busbar regions and then spread by capillary forces into the finger grooves 104. In the subsequent high temperature processing 254, dopant vapor such as of P or P-compounds originating from the filled grooves 104 can travel across the surface of the wafer to lightly dope the surrounding regions 106 to form a selective emitter. Metallization liquid may be provided in the same grooves 104 by a similar capillary dispensing method or by any other suitable method.

Thus, the regions at which a selective emitter is required, namely immediately at the locations 104 that will be metallized, are automatically provided with the required doping, without the need of a special mask or registration process. The additional doping activity takes place in the grooves, where the metallization will go, in a self-aligning manner. Further, the metallization is also automatically provided in the regions where it is desired to go, in a self-aligning manner. And, consequently, the metallization 107 and the selective emitter 105 regions are aligned to each other automatically, in a self-aligning manner. This is essentially a three-fold self-alignment: selective emitter 105 with desired location 104; metallization 107 with desired location 104 and selective emitter 105 with metallization 107.

In addition, the non-groove areas 106 could also be diffused with additional dopant, such as P activity, such as by $POCl_3$ in a furnace, such as a tube furnace or other suitable furnace, or by spraying or otherwise coating dopant-containing liquid to the whole cell surface, or by depositing a dopant-glass layer through dry vacuum or non-vacuum processes, such as atmospheric pressure chemical vapor deposition sputtering, evaporation and plasma enhanced chemical vapor deposition. These dopant layers or dopant glass layers can be of suitable thickness and have suitable dopant concentrations to represent an infinite source of dopant for diffusion into the wafer. Alternatively, by limiting the layer thicknesses and/or by limiting the concentration of dopant in the layer, these deposition methods could produce a layer with limited availability dopant that would diffuse dopant more slowly into the wafer than would a layer with infinite dopant availability.

All steps using such dopant applications are similarly conducted, typically before a high temperature step that changes the diffusion profile of the wafer. Dopant gas assistance (for example here by $POCl_3$) differs slightly, in that it is applied after the wafer has been heated to a temperature that would be high enough to change the dopant diffusion profile, had any dopant been present. The dopant made available from the $POCl_3$ then diffuses into the wafer, and even though the dopant provided by the $POCl_3$ could be of high availability, the greater degree of freedom one has with $POCl_3$ by heavily diffusing the groove regions before the dopant introduction means that one can still lightly dope in the non-groove regions by either choosing a lower temperature for the $POCl_3$ exposure and/or a short time during the $POCl_3$ exposure and subsequent drive-in step. In general, the low thickness or low concentration dopant sources constitute relatively limited availability of dopant for doping, as opposed to a relatively unlimited availability of dopant provided by the dopant dispensed into the grooves or by the glass formed by a long and/or high-flow $POCl_3$ exposure. As used herein and the claims below, limited availability source dopant shall be used to mean a low thickness or low concentration, or other similarly limited availability dopant source. Variables that can control the relative diffusion depths in the groove and non-groove areas include: dopant source type(s), dopant concentration and volume dispensed, time-temperature profile, atmosphere and flow and pressure during diffusion, and the point into the thermal profile history at which point additional dopant activity is introduced.

Thus, there are different ways to provide limited availability dopant for solar cell applications, which can be grouped into different categories. One category includes those applied as liquid sources to the wafer before heating the wafer to high temperature. Examples include: phosphoric acid and water mixtures; boric acid and water mixtures; phosphoric acid mixed with non-aqueous solutions to increase the viscosity for printing; boric acid mixed with non-aqueous solutions to increase the viscosity for printing; sol-gel systems with P and Si or B and Si or Ga and Si or As and Si or Al and Si, such are sold by Filmtronics. Later in a high temperature furnace, these react with the Si wafer and oxygen to form a glass layer, from which the dopant diffuses into the wafer. A second category includes those applied to form a dopant glass layer before heating the wafer to high temperature. Examples include: depositing a dopant glass layer containing P or B or Ga or As or Al by atmospheric pressure chemical vapor deposition, vacuum chemical vapor deposition, plasma enhanced chemical vapor deposition, or sputtering. Later in a high temperature furnace, the dopant diffuses into the wafer from the glass. A third category includes those applied within a vacuum furnace at high temperatures. Examples include bubbling $N_2$ gas through a liquid source of $POCl_3$ or $BBr_3$, vapor transport of dopant from an adjacent ceramic target containing the dopant, as is common in the semiconductor industry, vapor transport of a layer of dopant from the materials described in the first category, that has been applied to a sacrificial wafer or other planar substrate that is placed adjacent to the solar cell wafer. The dopant reacts with the Si wafer and oxygen to form a glass layer from which the dopant diffuses into the wafer.

With the $POCl_3$ assisted method 255, shown schematically in flow chart form in FIG. 2, and indicated as an alternative by the dashed border around the step, a high temperature processing step is conducted first in a tube without $POCl_3$ flow during which dopant diffuses into the grooves with dopant, and then diffusion 255 takes place everywhere after the flow of $POCl_3$ begins.

With a mist or spray diffusion assistance technique 253, as shown schematically in FIG. 2 and indicated as an alternative by the dashed border around the step, after dispensing high concentration dopant P-liquid in grooves (and optionally drying), limited availability dopant liquid is provided, such as by mist or spray or printing 253 or one of the other mentioned delivery techniques, everywhere. High temperature processing in a furnace follows with a change in the dopant diffusion profile. Dopants other than P can be provided by mist, spray, print or gas such as, boron from $BBr_3$ vapor, boron from boric acid solutions, or boron or aluminum or arsenic or gallium from a sol-gel source such as those sold by Filmtronics.

All of these variations can entail only a single high temperature step during which the diffusion profile changes. A second high temperature step is not required and there need be only one heating step during which there is any significant change in the diffusion profile. However, it is certainly possible to use two or more high-temperature diffusion-profile changing steps.

Figure 4A:
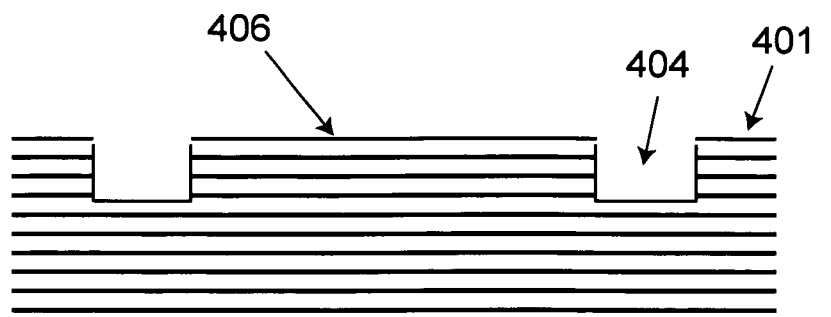
FIGS. 4A-4E are schematic representations in cross-section of a workpiece wafer at different stages of a process for applying dopant selectively using a diffusion-retarding material in specific, non-groove locations, and dopant distributed generally everywhere.
Figure 4B:
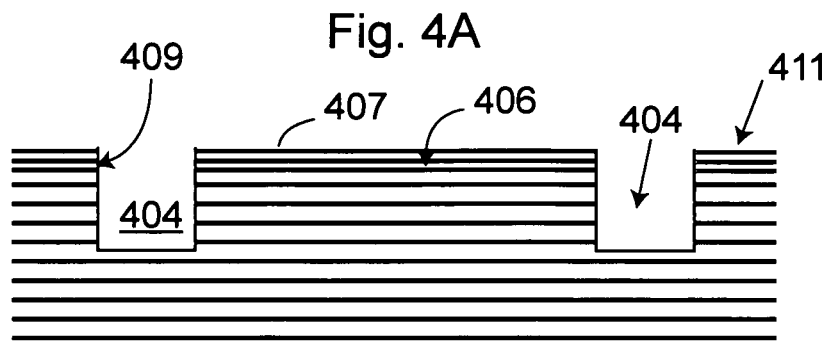
Figure 4C:
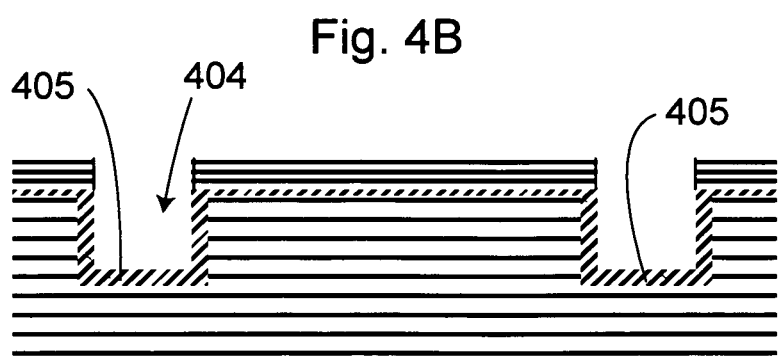
Figure 4D:
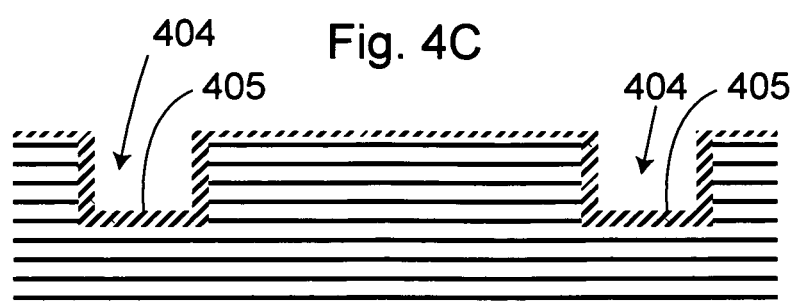
Figure 4E:
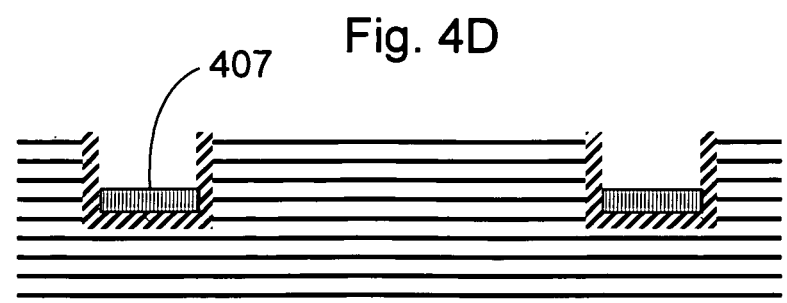
Figure 5:
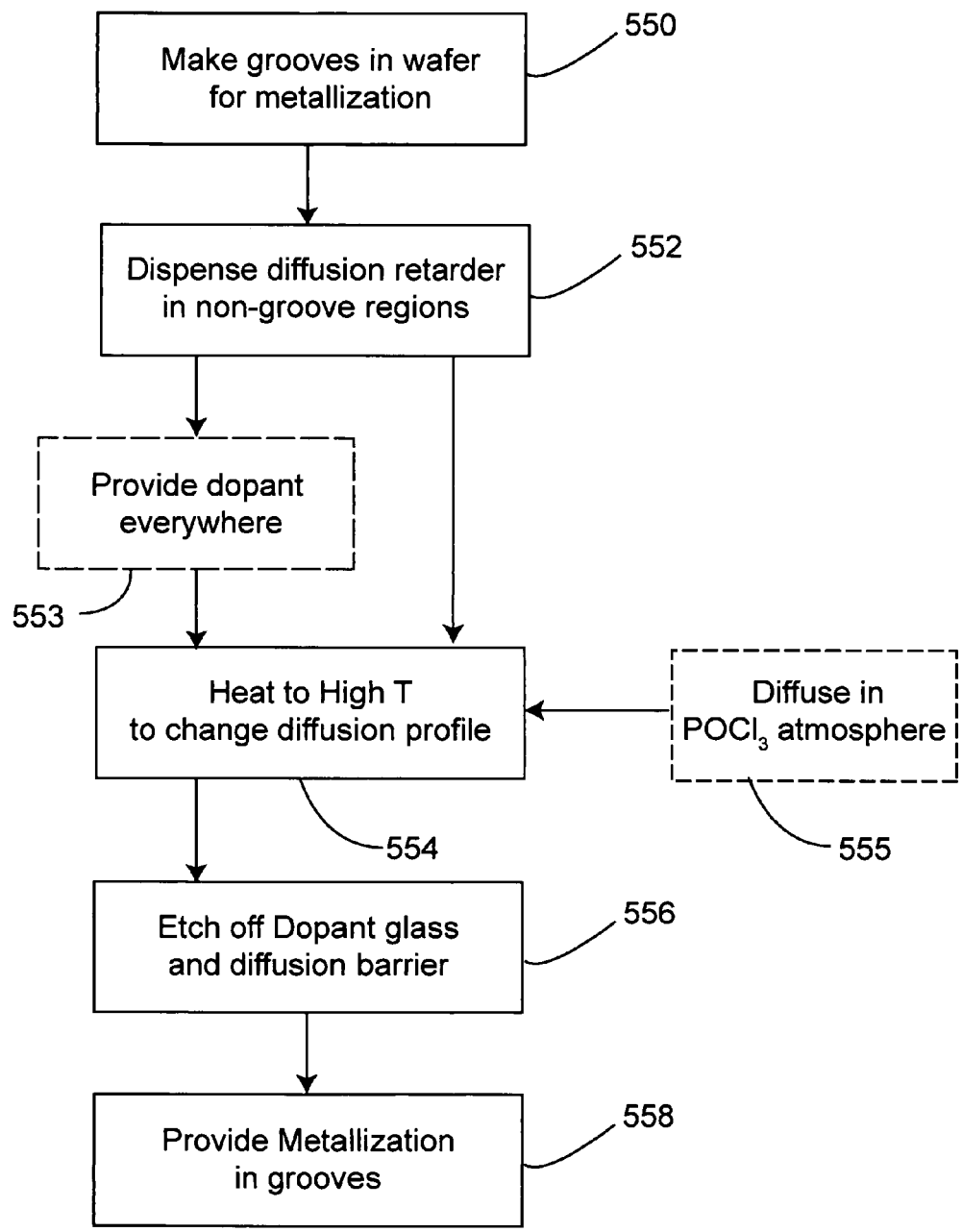
FIG. 5 is a schematic representation in flow-chart form of several typical process steps for applying dopant selectively to a workpiece wafer, using a diffusion-retarding material in specific non-groove locations, and dopant distributed generally everywhere, showing a basic method, and also several optional variations, one using $POCl_3$ assistance and another using deposited dopant assistance.

The following processes are illustrated with reference to FIGS. 4A-E, showing a workpiece at different stages of a process, and FIG. 5 showing typical process steps. As with the first described processes, a wafer 401 is provided 550 with grooves 404 for subsequent metallization. Diffusion-retarding material 407 is dispensed 552 in regions 406, where minimal diffusion is desired. Motivation for applying the diffusion-retarding material includes the ability to better control the level of doping in the non-metallization areas 406. For example, unprotected non-metallization areas 406 could unintentionally be doped from lateral vapor transport of the dopant deposited in the metallization grooves. Such doping may not be ideal, perhaps by doping more than desired or by being nonuniform across the wafer surface. The diffusion-retarding material 407 could reduce the undesired effect of such vapor doping and/or allow other sources of dopant to provide better controlled doping underneath the diffusion-retarding layer. Examples of diffusion-retarding materials include but are not limited to: sol-gel silica system, such as those sold by Filmtronics and Honeywell; and viscosity-modified versions of commercially available diffusion barrier pastes, such as Ferro 99-001 or Merck $SiO_2$ SolarResist ink.

As shown with reference to FIG. 4B, the diffusion-retarding material liquid 411 automatically self-aligns where it is desired to go, by virtue of the texture of the wafer, namely the edges 409 of the grooves 404 into which the metallization (FIG. 4E 407) will go. As explained in the SAC patent application mentioned above, a liquid can halt its flow along a surface at a barrier to flow, such as a corner or an edge 409, due to capillary forces, if the surface energies of the liquid and the surface are selected properly. Thus, diffusion-retarding material liquid 411 can be deposited in a general, but not precise location, such as the center of the span between two grooves 404, and it can flow outward toward each groove, and stop at the groove edge 409, rather than flowing into the groove, where it is not wanted. Thus, the entire wafer can be subjected 553 to a dopant source, and the regions at the grooves 404 can be doped to an elevated degree 405, as desired, automatically where desired, namely in the grooves 404, without the requirement of any special patterning technique or apparatus, such as a mask, or precise dispensing of liquid dopant. Similarly, metallization liquid can be provided into the grooves 404, to result in a metallization layer 407, precisely where it is desired, in the groove 404, and precisely aligned with the selective emitter region 405 of deeper doping. The metallization 407 may be provided in any appropriate manner, such as by a capillary dispensing method as discussed above.

As with the method discussed above that does not use a diffusion-retarder, with a diffusion-retarding material 411, there are variations that use diffusion assistance. According to one alternative shown in FIG. 5, limited availability dopant is provided 553, such as by misting, spraying, printing, or other techniques as discussed above. The workpiece is then subjected to a high temperature step 554 in a furnace, by which the dopant diffusion profile is changed, and dopant is diffused into the areas, such as in the grooves 404, that are not protected by the diffusion-retarding material 411. A glass containing the dopant phosphorus is formed, and this glass is subsequently etched off 556 along with the diffusion-retarding material. Metallization is provided 558 in the grooves, where the regions of deeper doping are located.

An alternative method uses a $POCl_3$ assistance 555 instead of misting, spraying, etc. 553. The high temperature step 554 is begun initially in the absence of any dopant in the atmosphere. During the high temperature step, $POCl_3$ assistance is then provided 555 at a later stage of the single high temperature step.

Figure 6A:
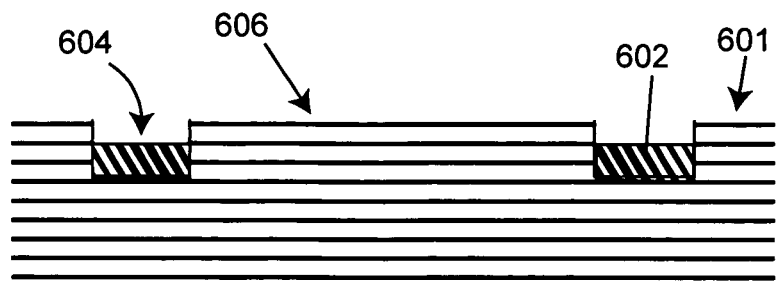
FIGS. 6A-6F are schematic representations in cross-section of a workpiece wafer at different stages of a process for applying dopant selectively in grooves, followed by a diffusion-retarding material generally everywhere.
Figure 6B:
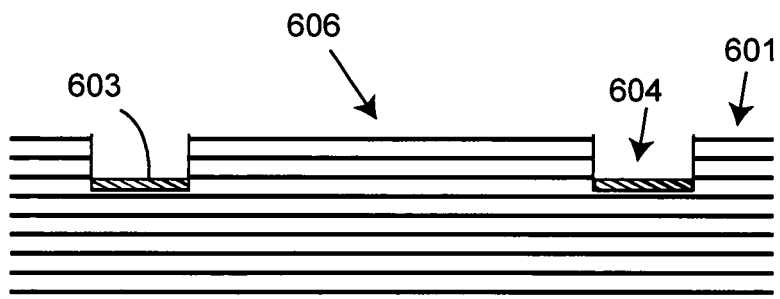
Figure 6C:
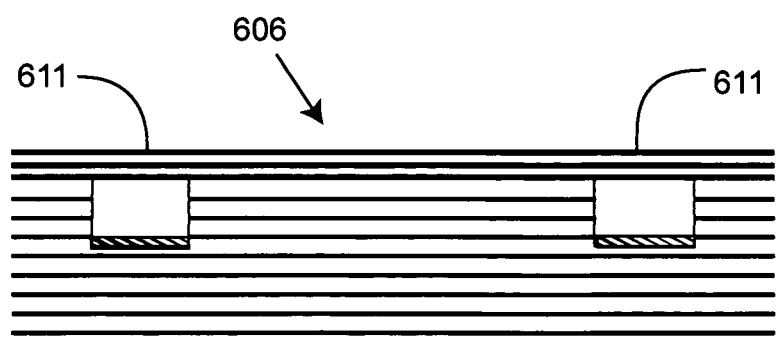
Figure 6D:
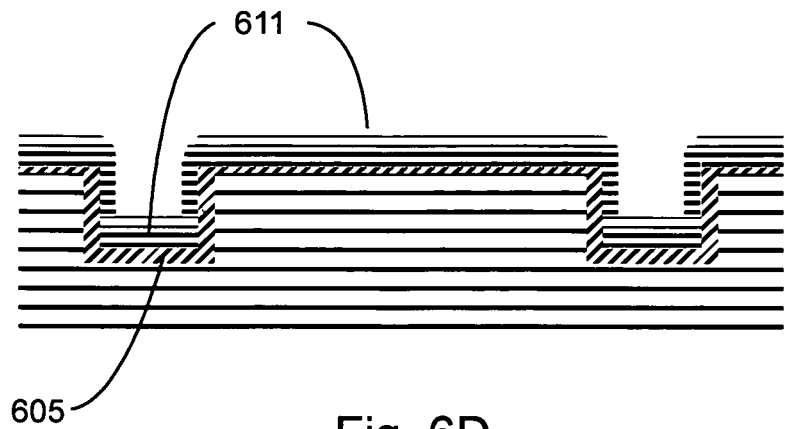
Figure 6E:
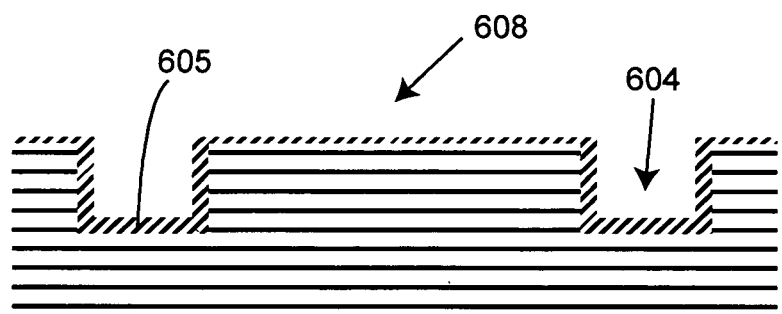
Figure 6F:
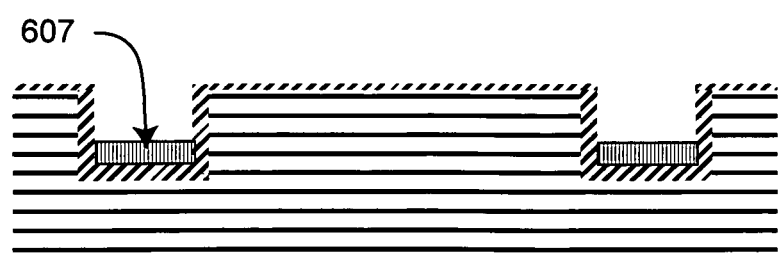
Figure 7:
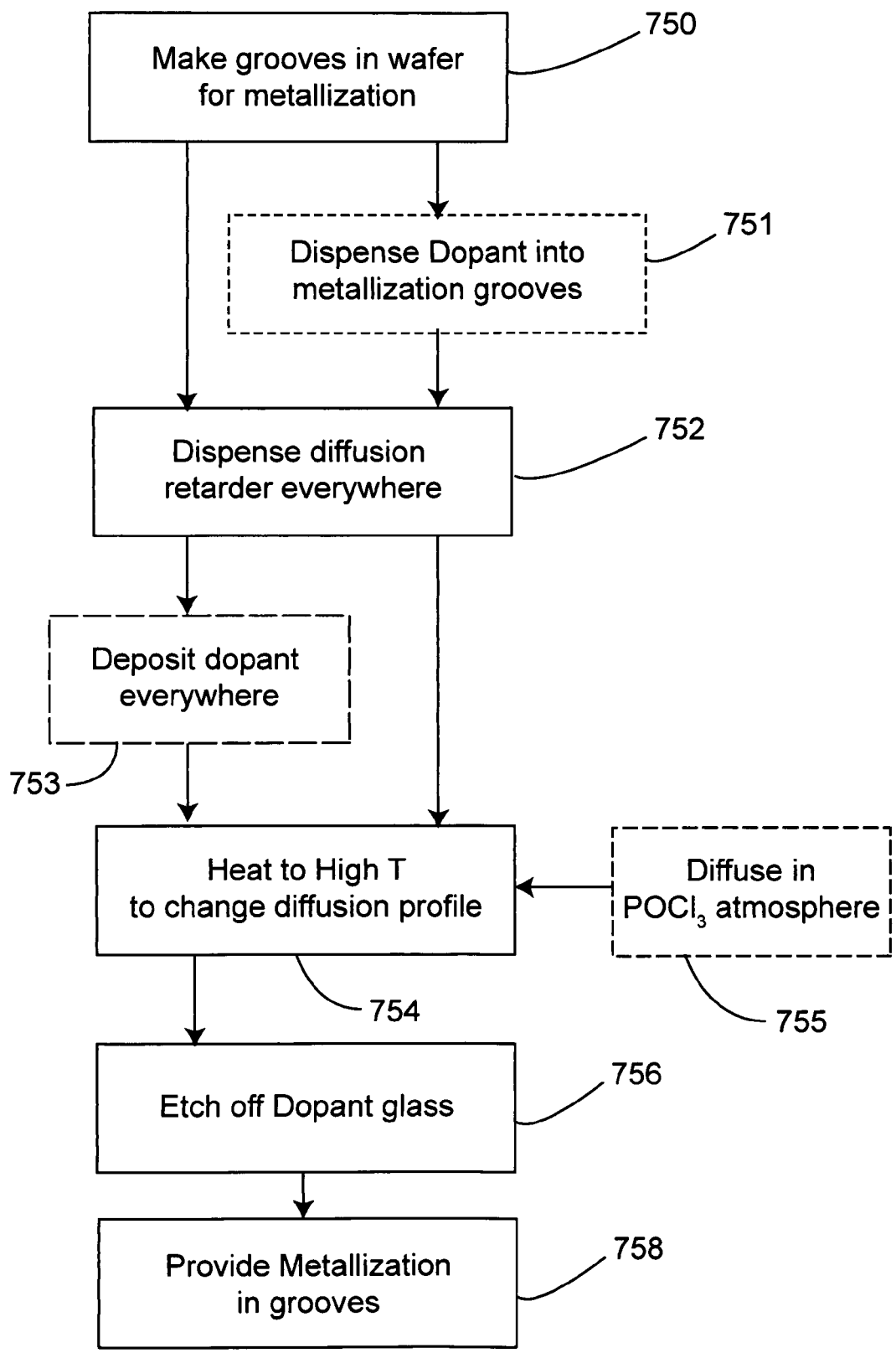
FIG. 7 is a schematic representation in flow-chart form of several typical process steps for applying dopant selectively to a workpiece wafer, applying dopant in grooves, followed by a diffusion-retarding material generally everywhere, showing a basic method, and also several optional variations, one using $POCl_3$ assistance and another using deposited dopant assistance.

Alternatively, as shown in FIGS. 6A-6F and FIG. 7, if a dopant 602, such as P-liquid is dispensed 751 first into the metallization-grooves 604, there may be no need to pattern the diffusion-retarding material as at 411 of FIG. 4B. Instead, as shown in FIG. 6F, a diffusion-retarding material 611 could be provided 752 over the entire surface. The dopant's 602 presence in the grooves 604 underneath the diffusion retarding material 611 will still allow diffusion to take place in the grooves. Liquid dopant application 753 on top of the diffusion retarding material 611 or $POCl_3$ assistance 755 could form a dopant glass 608 everywhere lightly diffuse dopant between the grooves. It is possible to dry the dopant liquid indicated by reduced volume dopant liquid 603 shown in FIG. 6B, and then place the wafer in a high temperature environment, or to skip the drying step. It is believed that surface tension would maintain the liquid in place, and it would dry away as it entered the high temperature environment.

In all of these related embodiments with diffusion-retarding material, the phosphorus glass is then etched away 756 leaving the state as shown in FIG. 6F.

Figure 8A:
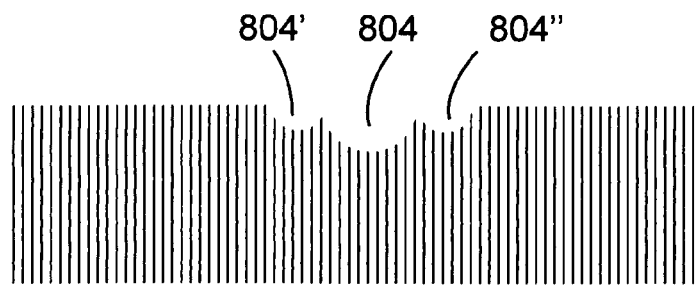
FIGS. 8A, 8B, 8C and 8D show, schematically, an embodiment of an innovation hereof using three or more grooves for each metallization finger.
Figure 8B:
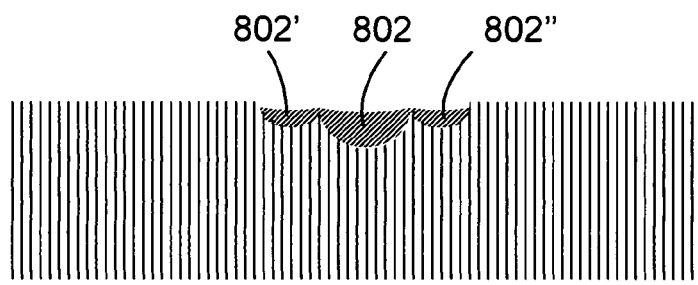
Figure 8C:
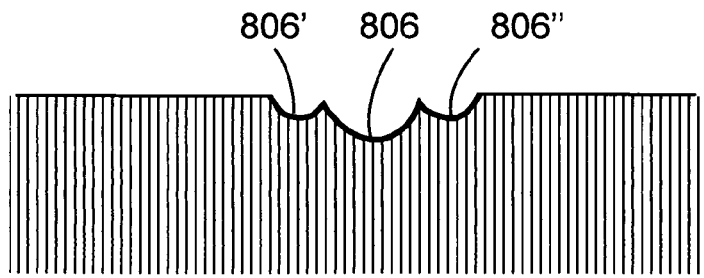
Figure 8D:
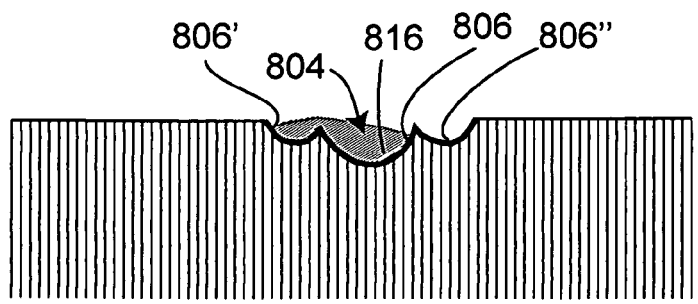

Instead of using a single metallization groove 604 for each finger, as shown schematically with reference to FIGS. 8A-D, it is beneficial to provide three or more grooves 804, 804' and 804" for each finger, whereby all three or more grooves are provided with liquid dopant 802, 802' and 802", respectively, applied in similar manners to those described above and below with respect to a single groove, and thus receive a heavy diffusion layer 806, 806' and 806", as shown in FIG. 8C. Metal 816 is intended to only be deposited in the center groove 804. The benefit of having a wider heavily diffused region 806, 806' and 806", around each finger 816, is to broaden the process window such that if metal 816 inadvertently is deposited outside the intended groove, such as in a side groove 804' or 804" or a portion of either, the deep emitter 806', 806" outside the center groove 804 will prevent the metal from shorting through what would otherwise be a shallow emitter. Resistive losses in the emitter would also be reduced by this approach, but at the expense of more current losses due to the poor blue response in the wider heavily diffused regions.

It is also important to note that in general, dopant liquid is typically dispensed in the metallization grooves, and only in the metallization grooves (except to the extent that it is also dispensed in light trapping grooves, as discussed below). In other words, methods disclosed herein are distinguished from any processes that may indiscriminately dispense dopant liquid everywhere. Thus, the liquid is dispensed in individual metallization grooves, or in grouped metallization grooves, such as described immediately above in connection with FIG. 8A, and in light trapping grooves, and nowhere else.

The microstructure of the metallization regions in industry-standard solar cells that do not have grooves for metallization is typically comprised of sintered metal particles with a semi-continuous layer of melted glass frit at the interface between the metal and the doped silicon. Items fabricated according to known techniques with grooves for metallization, as for example in a buried grid approach, would have plated, solid metal at that interface. The SAC and the capillary dispensing technologies provide the ability to deposit metallization ink into a very narrow groove. Known techniques involving masked plating have been employed in production of an all-plated cell, and these allow for deposition of plated metal on the non-masked narrow groove regions. This arises through selective deposition of Ni from a bath only in regions that are not covered by a SiN film. Such selectivity does not exist for deposition from metallization inks, consisting of metal particles and/or metallorganic metal, mixed with glass frit and/or liquid glass chemistry. For example, if one were to provide a wafer with grooves that are smaller than approximately 50 microns in width, the minimum line widths and the achievable alignment of known ink deposition techniques such as screen printing, pad printing, inkjet printing, direct write nozzle dispensing, etc., are not sufficient to place ink in the groove without ink also being deposited outside the groove regions in an undesirable manner.

With methods described herein, it is possible to provide metallization to such narrow grooves. Methods disclosed herein can maintain any regions of overflow beyond the edges of the grooves to approximately fifteen or even approximately ten microns. This is true even if the grooves are less than approximately forty-five microns or even approximately thirty microns wide. As an example, first metallization ink is dispensed as a seed layer, which, can have a typical overflow beyond the groove of between 0 and approximately 8 microns wide. Then additional metal is plated upon the seed, which causes the metallization line to grow in height, and also in width on each side by the same amount. For example, typically metal is plated up and out approximately 7-8 microns. Thus, starting with a 30 micron wide groove having a depth of between approximately 3 microns and 20 microns, and having overflow of three microns and plateout by seven microns, results in a final spill and plateout of ten microns on each side, which amounts to a 30+10+10=50 micron width. Thus not only is the method of producing a SAC cell with selective emitter disclosed herein, but a solar cell product made using metallization inks for the metallization seed layer is also disclosed herein.

To an observer the appearance of the all-plated cell may be similar to such a cell made according to innovations disclosed herein, with a metallization ink seed layer that is plated up to the same thickness as the all-plated buried grid process solar cells. However, upon microscopic and/or compositional analysis of the interface of a cell made according to innovations described herein, between the metal and silicon, one would find a semi-continuous layer of glass in this variation of the SAC cell, and none in the all-plated cell.

Deep Emitter Gridlines

The above selective emitter discussion concerns the grooves 104 (FIG. 1A), 404, (FIG. 4A), intended for metallization. A related process addresses other surface textures, including another type of grooves, which promote light trapping or absorption as described in the SAC technology patent application referred to above.

Figure 9A:
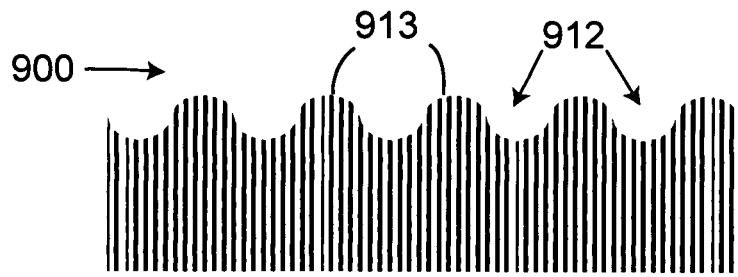
FIGS. 9A, 9B, 9C and 9D are schematic representations in cross-section along the lines A-A of FIG. 3B-II (below), of the workpiece wafer at different stages of a process for applying deep emitter gridlines, using a dopant dispensing method.
Figure 9B:
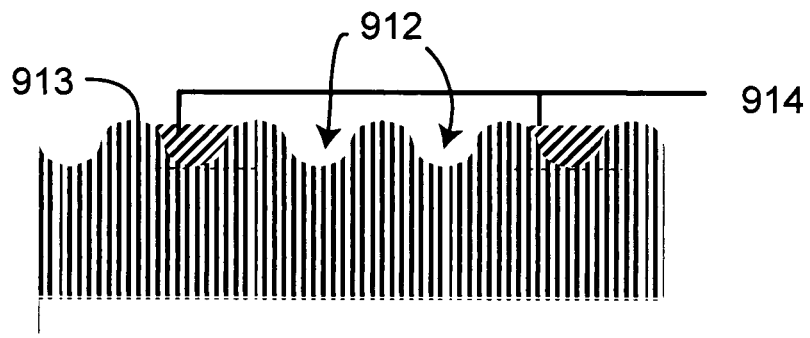
Figure 9C:
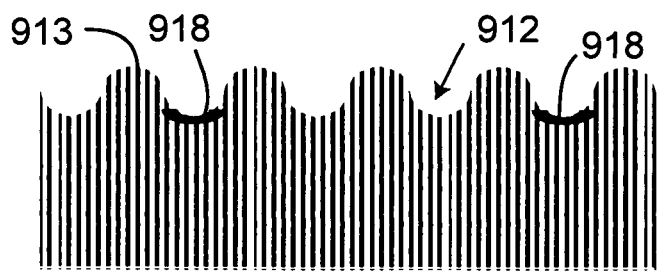
Figure 9D:
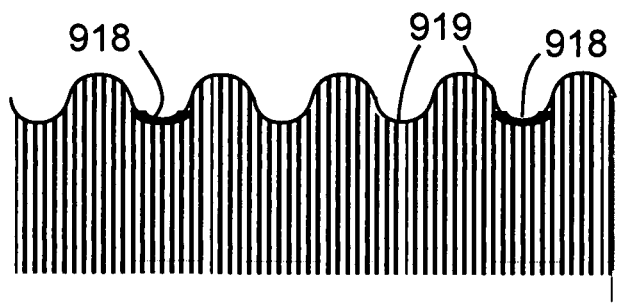
Figure 10:
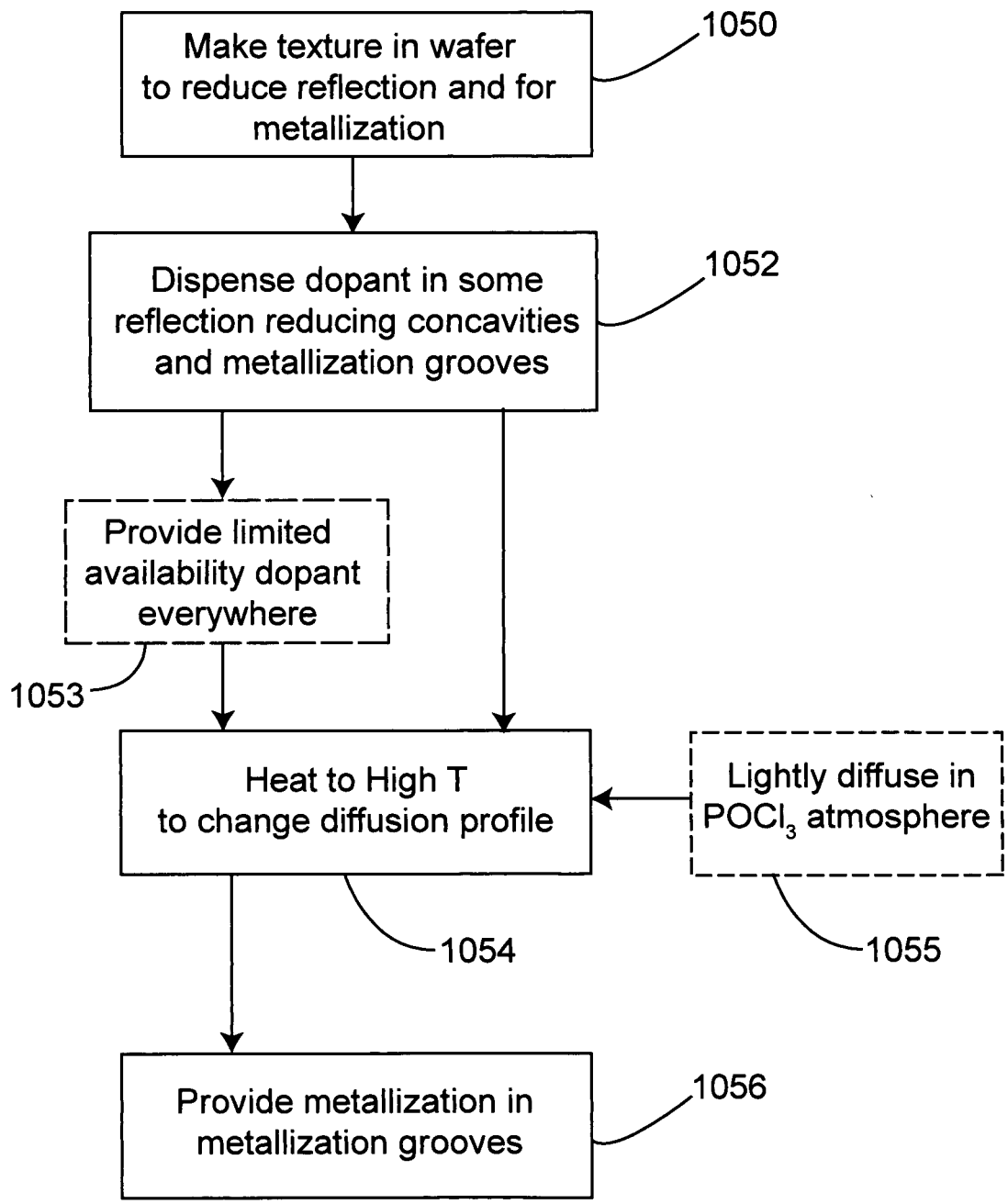
FIG. 10 is a schematic representation in flow-chart form of several typical process steps of a basic method for forming deep emitter gridlines, by dispensing dopant into the grooves, then diffusing the dopant into the grooves, and also showing two alternatives, one using POCl3 assistance, the other using mist or spray assistance to provide a limited dopant availability source to lightly dope everywhere.

FIGS. 9A-9D show cross-sections of a workpiece at different stages of a process, along the lines A-A of FIG. 9B-II. FIG. 9B-II shows a top view of the workpiece, at the stage shown in FIG. 9B. FIG. 9D-II shows a top view of the workpiece at a stage after that shown in FIG. 9D, which is also after a diffusion step. The stage shown in FIG. 9D-II is after a front metallization has been applied. FIG. 10, shows typical process steps, with several variations shown as alternatives.

The grooves 912 may be provided 1050 over some or all of the light-absorbing surface 900 of the cell and can be used for texturing for improved light trapping (reflection reducing). The grooves 912 alternate with the ridges 913. The metallization grooves are also provided, either at the same time the reflection reducing grooves are provided or at another time. Liquid dopant 914 can be dispensed 1052 into some portion of these light trapping grooves 912 to form deep emitter gridlines. The dopant may also be dispensed in the metallization grooves.

A high temperature step causes deep diffusion 1054 along these smaller grooves, where dopant was dispensed, and results in deep emitter gridlines that lead toward grooves where metal fingers will later be formed. As shown in FIG. 9D-II metallizion fingers 916 are provided in the metallization grooves 904.

There are several variations for the order of steps for creating deep emitter gridlines 918 with linked metallization 916. These are similar to above. One may have a single high temperature, diffusion profile-changing step and no other doping stages. (It is also possible for there to be additional high temperature doping stages, but these are not illustrated.) A second uses $POCl_3$ assistance. A third uses deposited dopant assistance.

The single step method, shown in flowhart form in FIG. 10, entails providing 1050 metallization grooves in a wafer, as well as grooves for reducing reflection. The method further entails dispensing 1052 dopant, such as P-liquid, into metallization grooves 904 and some of the light trapping grooves 912 that may be used for deep emitter gridlines 918. High temperature, diffusion profile changing processing 1054 follows in a furnace (with vapor lightly doping non-metallization groove areas) so that the entire surface is exposed to at least a small amount of dopant 919.

As shown in FIG. 10, the $POCl_3$ assisted method entails the same steps, followed by an alternative step (indicated as alternative, by a dashed outline) of diffusing 1055 $POCl_3$ to lightly dope the regions between the deep-emitter gridlines. Also as shown in FIG. 10, another alternative, a deposited dopant method shown in a dashed outline, entails depositing 1053 limited availability dopant liquid everywhere, followed by a single high temperature processing step 1054, in a furnace. Metallization is provided 1056 in the metallization grooves.

Figure 11A:
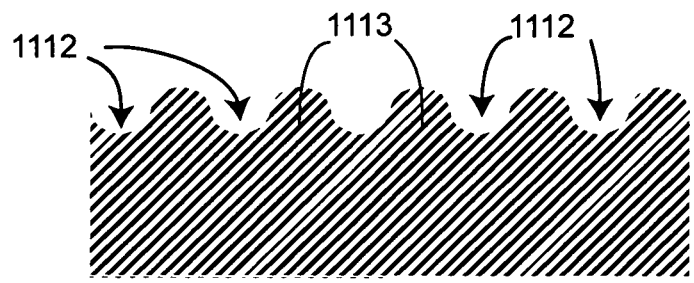
FIGS. 11A-D, are schematic representations in cross-section along the lines A-A of FIG. 11B-II (below), of a workpiece wafer having parallel light trapping grooves, at different stages of a process for applying deep emitter gridlines, using the diffusion-retarding material method.
Figure 11B:
Figure 11C:
Figure 11D:
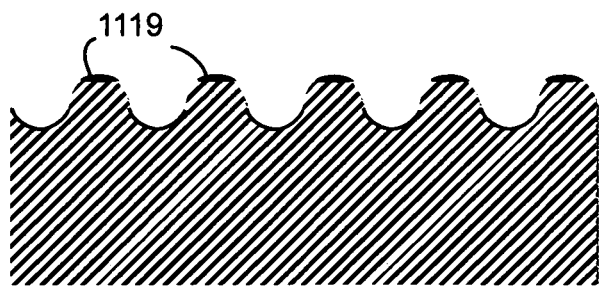
Figure 12:
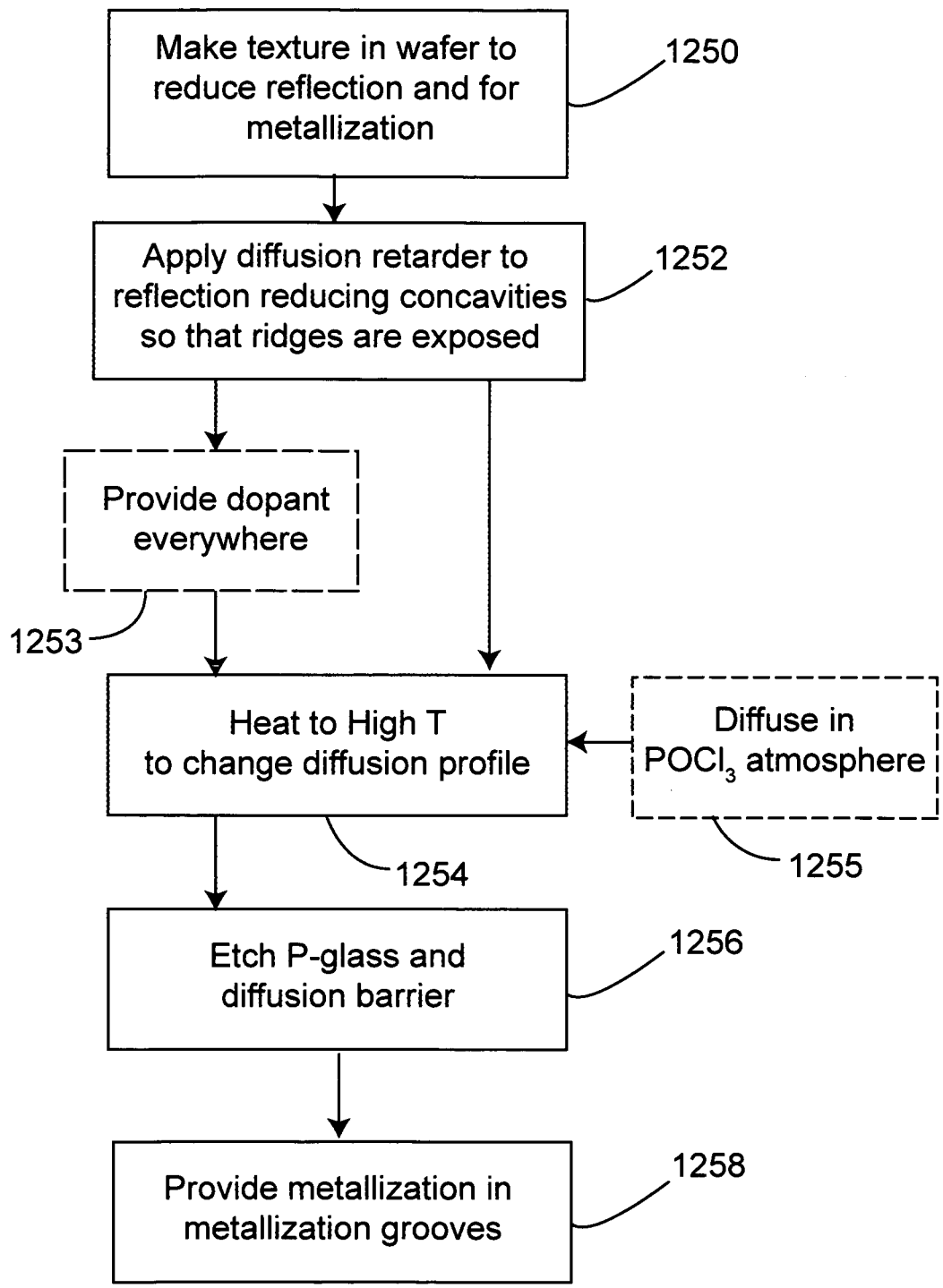
FIG. 12 is a schematic representation in flow-chart form of several typical process steps of a basic method for applying deep emitter gridlines, using a diffusion-retarding material, showing two alternative methods, one using POCl3 assistance, the other using a deposited dopant assistance.

Another process, shown in flow chart form in FIG. 12, uses a diffusion-retarding material (rather than dopant) in the concave light trapping concavities, such as grooves, provided 1250, as above. These processes are illustrated by FIGS. 11A-11D, which show a workpiece at different stages of a process, in cross-section along the lines A-A of FIG. 11B-II. FIG. 11B-II shows the workpiece in plan view at the stage shown in FIG. 11B. FIG. 11D-II shows the workpiece after the stage shown at FIG. 11D, which is after diffusion. FIG. 11D-II shows the workpiece after a front metallization has been applied. FIG. 12 shows typical process steps.

The metallization and light trapping grooves are provided 1250. A diffusion-retarding material 1107 may be applied 1252 to the light trapping texture concavities such as grooves 1112, and the wafer subsequently processed so that the bottom concave regions of the grooves 1112 are filled with the diffusion-retarding material 1107, while the ridges 1113 are exposed. The diffusion-retarding material is dried (which step is not shown). Dopant is then provided 1253 everywhere, as discussed below, including the exposed ridges 1113, which receive a deeper diffusion (indicated schematically by layer 1119) during the subsequent high temperature diffusion profile changing step 1254. The trough regions do not receive a deep diffusion, because the diffusion-retarding material prevents that. As is typical of any P diffusion step for Si solar cells, a phosphosilicate glass (P-glass) layer forms on the surface of the Si, and this is generally removed 1256 in a solution containing hydrofluoric acid to provide the states shown at FIGS. 11D and 11D-II. In the diffusion-retarding material cases described here, not only does the P-glass need to be etched, but in addition the diffusion-retarding material needs to be removed as well before the next processing step.

After high temperature processing 1254, the higher ridge regions with the heavier doping 1113 constitute deep emitter gridlines 1118 that lead toward regions 1104 that will later be metallized 1258 (FIG. 11D-II). A metallization 1116 is applied 1258 to metallization grooves 1104 at a later stage. (FIG. 11D-II).

As with the innovations discussed above, this embodiment may be practiced in several variations, which are all shown in flowchart form in FIG. 12, with some steps indicated as being alternatives. One alternative employs depositing dopant. Another uses $POCl_3$ diffusion assistance.

After the diffusion-retarding material is applied 1252 and dried, full strength dopant may be provided everywhere, such as by misting, spraying or printing 1253. The following high temperature, dopant diffusion profile changing step 1254 establishes the deep emitter doping.

The $POCl_3$ assistance method is similar. After the diffusion-retarding material is dried high temperature processing 1254 optionally takes place first in a tube and the $POCl_3$ is then diffused 1255. The ridges 1113 and metallization grooves thus receive a deep diffusion of P in this high temperature diffusion profile changing step 1254.

Deep Emitter Gridline Pathways

The embodiment just described takes advantage of the SAC architecture to place deep emitter gridlines 1119 perpendicular to the metallization fingers 1116, using light trapping grooves to help to direct various liquid materials in the process. As has been mentioned, other light trapping textures are also used, such as pits or craters arranged in patterns, such as a honey-comb pattern. Such light trapping textures can also be used in a self-aligning manner to provide deep emitter gridline activity. Co-assigned provisional U.S. Patent application Ser. No. 61/201,595, entitled WEDGE IMPRINT PATTERNING OF IRREGULAR SURFACE, filed on Dec. 12, 2008, and co-assigned PCT application, serial number PCT/US2009/(not yet assigned) under Express Mail Label No. EM355266258US, filed on even date herewith, entitled, WEDGE IMPRINT PATTERNING OF IRREGULAR SURFACE, in the names of Benjamin F. Polito, Holly G. Gates and Emanuel M. Sachs, and 1366 Technologies Inc. and The Massachusetts Institute of Technology, designating the United States of America, describe methods of making such a pitted and grooved surfaces. The Provisional application 61/201,595 and the PCT application serial no. not yet assigned, are both hereby incorporated fully herein by reference.

Figure 13:
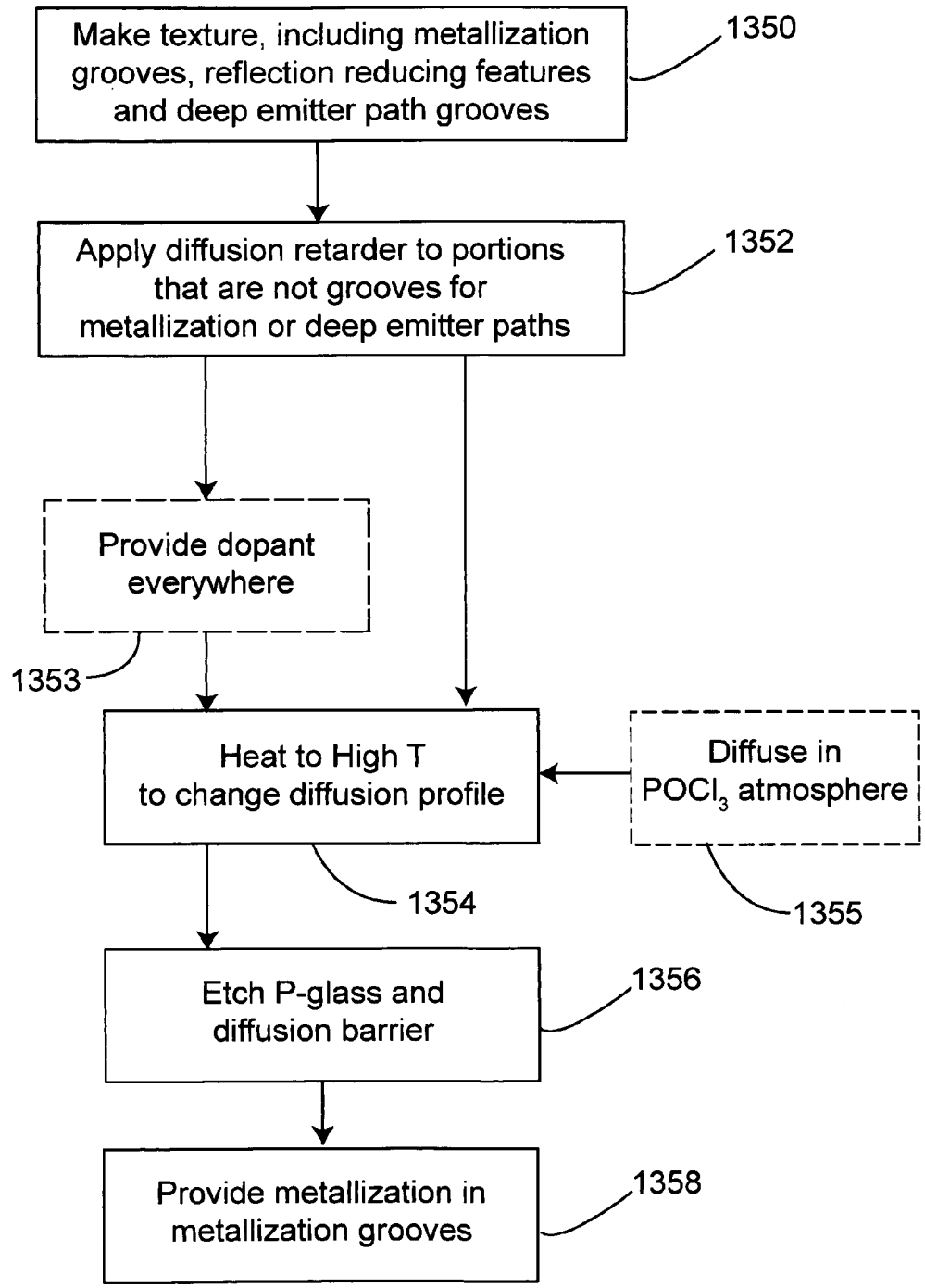
FIG. 13 is a schematic representation in flow-chart form of several typical process steps of a basic method for forming selective emitter regions and, and deep emitter gridlines using a diffusion-retarding material.
Figure 14:
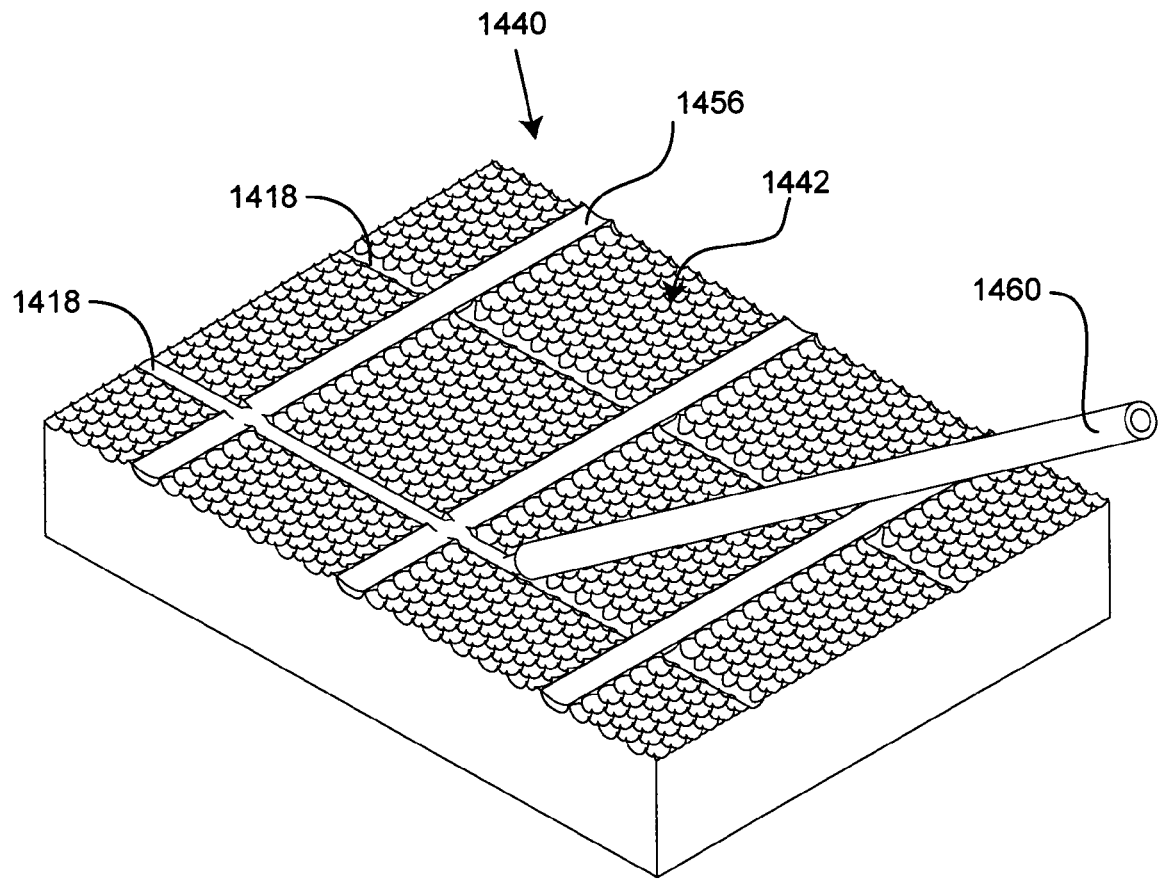
FIG. 14 shows, schematically, a semiconductor wafer, having a field of pits for light trapping purposes, and three grooves for metallization fingers, and, perpendicular thereto, two auxilliary grooves for deep emitter gridlines, with a capillary tube dispensing material containing liquid into one of the deep emitter grooves.

As shown schematically with reference to FIG. 13 in flow chart form, and schematically with reference to FIG. 14, an efficient process would include the step of providing 1350 the surface texture to the wafer, which would include both grooves for metallization 1456 and also light trapping texture, either grooves, or as shown, pits 1442, or something else. In general, pits provide better light trapping than grooves. A beneficial embodiment uses pits for light trapping. Additionally provided are grooves 1418 within the field of pits 1442 for a deep emitter gridline path, shown perpendicular to the metallization finger grooves 1456. (It is also possible to provide a deep emitter gridline pathway using ridges between pits, as explained below.) These three nominal textures may be provided all at once in one step 1350, or in two or more steps, either all the same, or different. Next, diffusion-retarding material can be provided 1352 in the regions that are not grooves for metallization 1456 or deep emitter paths 1418, which, in the case shown, is the region provided with pits 1442. Because of the texture, it is possible to provide liquid diffusion-retarding material in the pit regions, which will flow across the regions covered by pits, but will stop at the edges of the grooves that are provided for metallization fingers 1456 and deep emitter lines 1418. Thus, the process takes advantage of the self-aligning principals discussed in the SAC technology patents.

According to one alternative, dopant at full concentration may then be provided 1353 for example by misting, spraying, or printing, everywhere. That step would be followed by a high temperature heating step 1354, which diffuses the dopant into the wafer in the exposed regions, namely the metallization lines 1456 and the deep emitter gridlines 1418. The glass from the dopant and the diffusion-retarding material is etched 1356. Finally, metallization material is provided 1358 in the metallization grooves 1456. The metallization material can be provided by a capillary dispensing tube 1460 as discussed in the capillary dispensing application, U.S. Ser. No. 61/204,382, discussed above.

With a related alternative embodiment, indicated to be alternative by the dashed border, instead of providing dopant to the surface prior to heating, $POCl_3$ is provided to the furnace atmosphere during the high temperature step 1354.

Alternatively, the dopant may also be provided by such a capillary dispensing tube, as shown in FIG. 14, in which case no diffusion-retarding material is needed, because the dopant would be provided only in the limited regions where it is desired.

A discussion above mentions deeply diffusing the regions under the metallization to achieve a selective emitter. The more recent discussion relates to deep diffusion at regions that are not beneath metallization. It is possible to provide deep diffusion under the metallization regions only, or at the light trapping features only, or in both regions. When provided in both regions, it is most efficient to provide the dopant for both of these diffusions in the same step. This might be accomplished, for example, by masking with a diffusion-retarding material some portion of the area in the light trapping regions, then diffusing the non-masked light trapping features, such as emitter lines, and the metallization grooves simultaneously to the same degree during a $POCl_3$ diffusion step.

This method then takes advantage of the efficiencies provided by the self aligned cell architecture, in that the locations where the dopant and the diffusion-retarding material go are dictated by the geometry, without the need for a complicated mask or registration step. Further, the diffusion-retarding material can be provided in a single step for all purposes. Further, only one high temperature, diffusion profile changing step is required for establishing not only the patterned diffusion layer beneath the metallization, but also the patterned diffusion layer associated with the light trapping regions. Of course, additional high temperature steps may be conducted, but only one is required.

The method steps are similar for embodiments using light trapping pits as for embodiments using the light trapping grooves, illustrated schematically in flowchart form in FIG. 12.

A wafer is provided with a plurality of overlapping pits, which may be arranged in a variety of patterns. A honeycomb pattern has been found to be useful. A diffusion-retarding liquid material is provided to the pits, and the wafer subsequently processed so that the bottom regions of the pits are filled with the diffusion-retarding material, while the perimeter edge ridges are exposed, to receive a deeper diffusion during the subsequent high temperature processing step, in the same manner as ridges between troughs receive such a deeper diffusion. For instance, as in the example discussed above in connection with FIG. 12, after the diffusion-retarding material is applied, the wafer can be subjected to application of a dopant, such as by misting or spraying, or printing. Then, the wafer is provided in a furnace and subjected to a high temperature so that the dopant diffusion profile changes, leaving the upper edges converted to a deep emitter grid pathway, that covers the entire area that was not masked by the diffusion-retarding material. The shape of this pathway will depend upon the shape of the pits and the volume of the pits that was covered by the diffusion-retarding material. Alternatively, the application of dopant prior to heat could be replaced by exposure to $POCl_3$ within the furnace.

Turning next to variations in the arrangement of the light trapping grooves 912 (FIG. 9), relative to the metallization grooves 904, there are at least two general variations. Some light trapping grooves 912 may be hydraulically coupled to the metallization grooves 904, and/or each other so that liquid that is provided in the metallization grooves also travels to the coupled light trapping grooves, as shown in FIG. 9B-II. Alternatively, some or all of the light trapping grooves 912 may be hydraulically isolated from any other groove, and may be filled individually. If the light trapping grooves are hydraulically coupled to some other light trapping grooves or metallization grooves, then all coupled grooves may be filled by dispensing liquid into a coupled groove, and facilitating fluid flow. In the isolated configuration, each isolated groove must have liquid directly dispensed to it.

The dispensing step may be by a capillary tube, as discussed above into individual light trapping grooves 912. Or, conceivably, some fraction of these light trapping grooves 912 could be connected together hydraulically, to allow dispensing 1052 and flow of dopant P-solution 914 from one light trapping groove to another, separately from the dispensing for the metallization grooves 904. The dimensions of these light trapping grooves 912 are smaller than the metallization grooves 904, and thus there might be some challenges in achieving flow of the liquid 914 along the smaller grooves 912.

One shortfall of the isolated configuration is that there will be a small gap at the locations 915 (FIG. 9D-II), between the texture grooves 904 for the metallization fingers 916, and the light trapping grooves 912 for the deep emitter gridlines 918. Thus the current would have to pass through a short high resistance region at the locations 915 to get to the metal fingers 916, but most of benefits should still be achieved. (FIG. 9D-II does not show such a problematic gap, merely showing where it would be if it were present.) The percentage of absorber area where it may be beneficial to be covered by the deeply diffused deep emitter gridlines would be between 1 and 50%.

Figure 15:
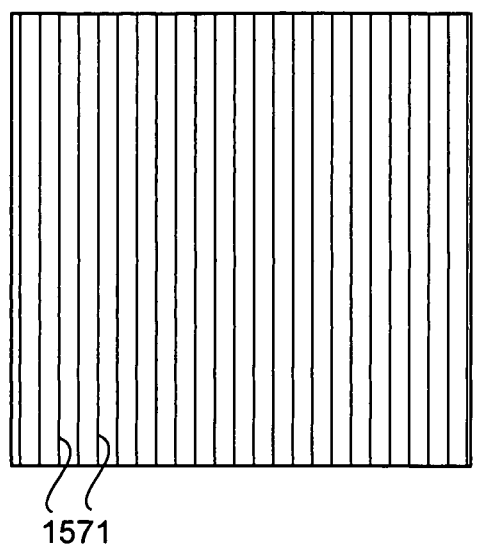
FIG. 15 shows, schematically in a plan view a backside of a wafer after formation of p+ backsurface field lines.
Figure 16:
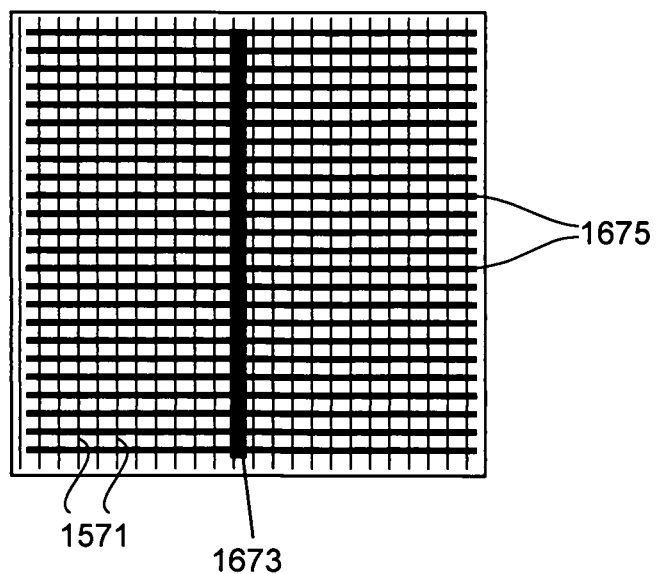
FIG. 16 shows, schematically the backside of a wafer shown in FIG. 15, further after metal fingers and a metal busbar have been printed and/or deposited.

These general approaches of selective diffusions could be applied to other cell structures such as interdigitated back contacts. Likewise, just as patterned deep emitter lines can help bring current to front surface metal fingers, as shown in FIG. 15, patterned back surface field lines 1571 of a wafer can be used to help bring current to a back metal grid structure, including, as shown schematically with reference to FIG. 16, a busbar 1673 and fingers 1675. As is typical, the busbar can be primarily Ag (silver), and the fingers can be Al (aluminum) or primarily Ag.

Innovations disclosed herein could be applied to diffusion of dopants other than P, such as As, Ga, B or Al. Phosphorus or Arsenic dopants could be used also to form back surface field regions to contact the base on n-type wafer substrates. Or equivalently, Boron, Gallium or Aluminum dopants could be likewise used to form emitters on n-type substrates, and back surface field contacts to the base on p-type wafer substrates. Additionally, the deep emitter line concept achieved by a patterned blocking layer could be applied to surfaces that have patterns other than a grooved and honeycomb surface, for example an isotexture. Additionally, the type of metallization seed layer applied to the deeply diffused grooves of the selective emitter SAC architecture could be materials other than the plated metals, such as Ni, mentioned above. Some examples include pastes or inks of metal powders and glass frit, such as Ag, such as are sold by Dupont and Ferro, or organometallic mixtures of metal and glass chemistries. These approaches could be applied to other electronic devices where selective diffusions are desired with a minimum of masking and processing steps.

While particular embodiments have been shown and described, it will be understood by those skilled in the art that various changes and modifications may be made without departing from the disclosure in its broader aspects. It is intended that all matter contained in the above description and shown in the accompanying drawings shall be interpreted as illustrative and not in a limiting sense.

SUMMARY

Methods of exploiting a Self Aligned Cell (SAC) architecture for doping purposes use either the architecture to direct the deposition and application of a material that dopes the substrate, or a material that blocks or retards the substrate from being doped. Some innovations provide doping in the regions that will become metallization for current conducting fingers. The dopant may be treated directly into grooves that have been provided for the purpose. Or, a diffusion-retarding material may be provided in non-groove locations, and dopant may be provided with less precision over the entire surface of the wafer, thereby resulting in only the diffusion-retarder free regions getting the full dopant dose. The SAC architecture also includes grooved or pitted surfaces for the light absorbing regions of a cell, to prevent or minimize reflection away of light energy. The light trapping regions may also be treated with dopant in the grooves, to result in semi-conductor emitter lines within the grooves. Alternatively, a diffusion-retarding material may be treated into the grooves, leaving the upper tips of the ridges between the grooves exposed, thereby subject to deeper, or more significant doping in a subsequent step Similarly, with light trapping pits, a diffusion-retarding material may be treated into the pits, leaving the upper rim of the edges between the pits exposed, thereby subject to deeper doping.

A preferred embodiment of a method hereof is method of providing a solar cell with a patterned diffusion layer, comprising the steps of: providing a semiconductor wafer; providing grooves in the semiconductor wafer; dispensing dopant liquid into the grooves; heating the wafer in a high temperature application for a duration that diffuses the dopant into the wafer; and dispensing metallization material that contains liquid into the grooves; thereby creating a patterned diffusion layer at metallization locations.

With a beneficial version of this embodiment, either or both of the steps of dispensing dopant and dispensing metallization material may be conducted through a capillary tube, which may contact the wafer directly.

For a robust variation of this embodiment the grooves are provided in groups of at least two adjacent grooves, metallization material is dispensed into at least one, and possibly two ore more grooves of any single group of grooves.

Typically, limited availability dopant may be provided using spraying, misting, or printing a dopant containing liquid.

Alternatively, or in addition, limited availability dopant may be provided by depositing a dopant glass by sputtering, evaporation, plasma enhanced chemical vapor deposition, vacuum chemical vapor deposition, or atmospheric pressure chemical vapor deposition.

It is possible, during the step of diffusing the dopant into the wafer in a high temperature application, to expose the wafer to a doping gas such as POCl3 or BBr3.

Another important embodiment of a method hereof is a method of providing a solar cell with a patterned diffusion layer, comprising the steps of: providing a semiconductor wafer; providing grooves in the semiconductor wafer; providing diffusion-retarding material in non-groove regions of the wafer and not in the grooves; providing dopant to the entire surface of the wafer; heating the wafer in a high temperature application for a duration that diffuses the dopant into the wafer; and dispensing metallization material that contains liquid into the grooves; thereby creating a patterned diffusion layer at metallization locations.

Yet another embodiment provides liquid dopant in the grooves before providing diffusing-retarding material.

Dopant may be provided by spraying, misting, or printing a dopant containing liquid.

Alternatively, or in addition, dopant may be provided by depositing a dopant glass using sputtering, evaporation, plasma enhanced chemical vapor deposition, vacuum chemical vapor deposition, or atmospheric pressure chemical vapor deposition.

With the embodiments using a diffusion retarding material, it is also useful, during the step of diffusing the dopant into the wafer in a high temperature application, to expose the wafer to a doping gas such as POCl3 or BBr3. Further either or both of the steps of dispensing dopant and dispensing metallization material may be conducted through a capillary tube, which may contact the wafer directly.

Still another beneficial embodiment of an invention hereof is a method of providing a solar cell with a patterned diffusion layer, comprising the steps of: providing a semiconductor wafer; providing grooves in the semiconductor wafer; providing dopant liquid into the grooves; providing diffusion-retarding material over the entire surface of the wafer, including the grooves; diffusing the dopant into the wafer at high temperature; and dispensing metallization material that contains liquid into the grooves, thereby creating a patterned diffusion layer at metallization locations.

If dopant is provided over the entire surface, it may be provided by any of the methods mentioned recently above.

A particularly attractive embodiment of an invention hereof is a method of providing a solar cell with a patterned diffusion layer, comprising the steps of providing a semiconductor wafer; providing a region of concave texture in the semiconductor wafer configured to enhance light trapping characteristics of the wafer as compared to a flat surface wafer; providing grooves in the wafer for metallization; within the region of concave texture, providing grooves in the wafer that intersect the grooves for metallization, for deep emitter gridlines; providing dopant to the grooves for deep emitter gridlines; heating the wafer at high temperature for a duration that diffuses the dopant into the wafer; and dispensing metallization material that contains liquid into the grooves for metallization; thereby creating a patterned diffusion layer that intersects with metallization locations.

It is useful to provide dopant to the grooves for metallization before the step of heating, thereby creating a patterned diffusion layer that also is located at metallization locations.

At least one of the following steps may be conducted by dispensing liquid through a capillary tube, which may contact the wafer directly: providing dopant to the grooves for deep emitter gridlines; dispensing metallization material that contains liquid into the grooves for metallization; and providing dopant to the grooves for metallization. The concave texture may be pits or grooves, or some other structure.

As with the above discussed embodiments in this summary, limited availability dopant may be provided, and it may be done using spraying, misting, or printing a dopant containing liquid, or depositing a dopant containing glass, using any of the methods discussed therefore.

Another embodiment of an invention hereof is a solar cell comprising: a silicon base wafer, having a doping type; grooves for metallization, having a width that is less than approximately sixty microns and a depth greater than approximately 3 microns; metallization within the grooves, which does not extend more than approximately fifteen microns to either side of the respective groove, along the wafer surface; doping under the metallization, which is deeper than doping that exists on the wafer surface in regions not under the metallization grooves; and at an interface between the metallization and the more deeply doped silicon, a semi-continuous glass layer.

The groove width may be less than approximately forty-five microns and even narrower than thirty microns.

Beneficially, the metallization does not extend more than approximately ten microns to either side of the respective groove.

A related embodiment further comprises deep emitter gridline regions that intersect the metallization within the grooves, which deep emitter gridline regions also comprise deeper doping than that which exists on the wafer surface in regions not under the metallization grooves and not at the deep emitter gridline regions Beneficially, the cell further comprises a region of concave texture in the semiconductor wafer, configured to enhance light trapping characteristics of the wafer as compared to a flat surface wafer. The concave texture mauy comprise pits or grooves or both.

With all major variations disclosed herein, according to a useful embodiment, the wafer is a p-type semiconductor substrate, the dopant being such as to create an $n^+$-type semiconductor, the diffusion layer comprising a solar cell emitter. Or, the wafer may be a p-type semiconductor substrate, the dopant being such as to create a $p^+$-type semiconductor, the diffusion layer comprising a solar cell back surface field region. Yet another related embodiment has the wafer comprising an n-type semiconductor, the dopant being such as to create an $n^+$-type semiconductor, the diffusion layer comprising a back surface field region.

Many techniques and aspects of inventions have been described herein. The person skilled in the art will understand that many of these techniques can be used with other disclosed techniques, even if they have not been specifically described in use together. For instance a dopant can be dispensed and positioned by exploiting the SAC techniques, and the workpiece can then be processed in any appropriate manner, whether described here, or not. Similarly, a diffusion retarding material can be deposited and positioned by exploiting the SAC techniques, and dopant may be subsequently applied by any suitable means, whether disclosed herein or not. Diffusion-retarding material may be deposited everywhere, or in specific locations, as directed by the SAC architecture. One or more applications of diffusion-retarding material may be provided, each in different locations, as directed by the architecture. Similarly, dopant may be applied, diffused, and then more dopant may be applied for another purpose, again, directed to positions by the SAC architecture.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

What is claimed is:

1. A method of providing a solar cell with a patterned diffusion layer aligned with a metallization, comprising the steps of:
   a. providing a semiconductor wafer;
   b. providing grooves in the semiconductor wafer;
   c. dispensing dopant liquid into the grooves;
   d. heating the wafer in a high temperature application for a duration that diffuses the dopant into the wafer; and
   e. providing metallization material to the grooves;

thereby creating a patterned diffusion layer aligned with metallization and groove locations.

2. The method of claim 1, the step of providing metallization material comprising dispensing metallization material through a flexible tube.

3. The method of claim 2, the flexible tube contacting the wafer directly.

4. The method of claim 1, further wherein the grooves are provided in groups of at least two adjacent grooves, wherein the step of dispensing metallization material into the grooves comprises dispensing metallization material into at least one groove of any single group of grooves.

5. The method of claim 4, the step of dispensing metallization material comprising dispensing metallization material into at least portions of two grooves of any single group of grooves.

6. The method of claim 1, the wafer comprising a p-type semiconductor substrate, the dopant being such as to create an $n^+$-type semiconductor, the diffusion layer comprising a solar cell emitter.

7. The method of claim 1, the wafer comprising a p-type semiconductor substrate, the dopant being such as to create a $p^+$-type semiconductor, the diffusion layer comprising a solar cell back surface field region.

8. The method of claim 1, the wafer comprising an n-type semiconductor substrate, the dopant being such as to create a $p^+$-type semiconductor, the diffusion layer comprising a solar cell emitter.

9. The method of claim 1, the wafer comprising an n-type semiconductor, the dopant being such as to create an $n^+$-type semiconductor, the diffusion layer comprising a back surface field region.

10. The method of claim 1, further comprising, before the step of diffusing the dopant into the wafer, a step of providing limited availability dopant to the wafer.

11. The method of claim 10, the step of providing limited availability dopant comprising using a method selected from the group consisting of: spraying, misting, and printing a dopant containing liquid.

12. The method of claim 10, the step of providing limited availability dopant comprising depositing a dopant glass using a method selected from the group consisting of: sputtering, evaporation, plasma enhanced chemical vapor deposition, vacuum chemical vapor deposition, and atmospheric pressure chemical vapor deposition.

13. The method of claim 1, further comprising, during the step of diffusing the dopant into the wafer in a high temperature application, a step of exposing the wafer to a doping gas selected from the group consisting of $POCl_3$ and $BBr_3$.

14. The method of claim 1, the step of dispensing dopant comprising dispensing dopant through a flexible tube.

15. The method of claim 14, the flexible tube contacting the wafer directly.

16. The method of claim 15, further, in that, through motion of at least one of the tube and wafer relative to each other the tube moves along the length of the grooves.

* * * * *